United States Patent
Nishimura et al.

(10) Patent No.: US 9,152,054 B2
(45) Date of Patent: Oct. 6, 2015

(54) EXPOSURE DEVICE, SUBSTRATE PROCESSING APPARATUS, METHOD FOR EXPOSING SUBSTRATE AND SUBSTRATE PROCESSING METHOD

(71) Applicants: Kazuhiro Nishimura, Kyoto (JP); Akihiko Morita, Kyoto (JP); Yukihiko Inagaki, Kyoto (JP)

(72) Inventors: Kazuhiro Nishimura, Kyoto (JP); Akihiko Morita, Kyoto (JP); Yukihiko Inagaki, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 270 days.

(21) Appl. No.: 13/845,211

(22) Filed: Mar. 18, 2013

(65) Prior Publication Data

US 2013/0258299 A1    Oct. 3, 2013

(30) Foreign Application Priority Data

Apr. 2, 2012   (JP) ................. 2012-083739
Jun. 4, 2012   (JP) ................. 2012-127368

(51) Int. Cl.
G03B 27/32   (2006.01)
G03B 27/52   (2006.01)
G03F 7/20    (2006.01)
G03F 7/00    (2006.01)
G03F 7/38    (2006.01)

(52) U.S. Cl.
CPC ........... *G03F 7/2012* (2013.01); *G03F 7/0035* (2013.01); *G03F 7/38* (2013.01)

(58) Field of Classification Search
CPC .. G03F 7/70891; G03F 7/2012; G03F 7/7035
USPC ................................. 355/27, 30, 53
See application file for complete search history.

(56) References Cited

U.S. PATENT DOCUMENTS

| | | | |
|---|---|---|---|
| 2003/0213431 A1 | 11/2003 | Fukutomi et al. | 118/696 |
| 2004/0161548 A1 | 8/2004 | Nagashima et al. | 427/558 |
| 2005/0250056 A1* | 11/2005 | Kawano et al. | 430/330 |
| 2009/0142713 A1 | 6/2009 | Yamamoto | 430/325 |
| 2010/0266969 A1 | 10/2010 | Shiraishi et al. | 430/325 |
| 2012/0207940 A1 | 8/2012 | Muramatsu et al. | 427/510 |

FOREIGN PATENT DOCUMENTS

| | | |
|---|---|---|
| JP | 2003-324139 | 11/2003 |
| JP | 2004-261801 | 9/2004 |

(Continued)

OTHER PUBLICATIONS

Notice of Reasons for Refusal dated Aug. 18, 2015 in corresponding Japanese Patent Application No. 2012-127368.

*Primary Examiner* — Hung Henry Nguyen
(74) *Attorney, Agent, or Firm* — Ostrolenk Faber LLP

(57) ABSTRACT

In an entire region exposure unit, a platform section and a local transfer mechanism are arranged in one direction. The local transfer mechanism is provided with a local transfer hand. A substrate on which a resist film having a predetermined pattern is formed is held by the local transfer hand. A light-emitting device is attached to the upper portion of the local transfer mechanism. Strip-shaped light is emitted from the light-emitting device toward below. The local transfer mechanism operates such that the local transfer hand is moved relative to the light-emitting device. At this time, the light-emitting device irradiates one surface of the substrate that is moving horizontally with the strip-shaped light. The resist film is modified by the light.

14 Claims, 26 Drawing Sheets

(56) References Cited

FOREIGN PATENT DOCUMENTS

| JP | 2005-197348 | | | 7/2005 |
|----|----|----|----|----|
| JP | 2009-135169 | | | 6/2009 |
| JP | 2009/00410 | A | * | 8/2009 |
| JP | 2010-034209 | | | 2/2010 |
| JP | 2010-250177 | | | 11/2010 |

* cited by examiner

F I G. 4 (a)
INITIAL STATE
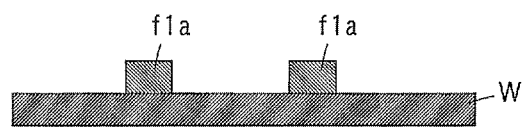
F I G. 4 (b)
ENTIRE REGION EXPOSURE PROCESSING
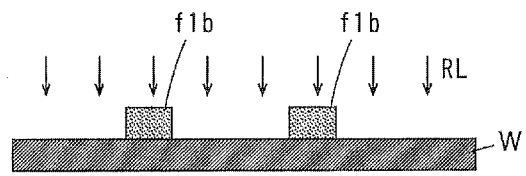
F I G. 4 (c)
INTERMEDIATE LIQUID COATING PROCESSING + THERMAL PROCESSING
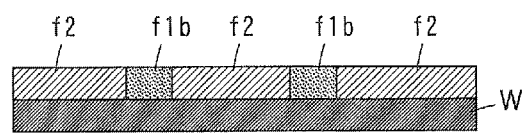
F I G. 4 (d)
DEVELOPMENT PROCESSING
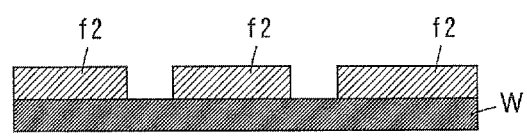
F I G. 4 (e)
DSA LIQUID COATING PROCESSING
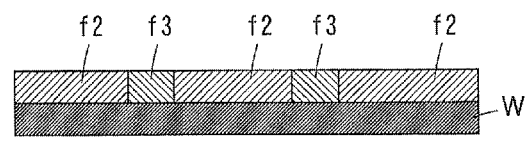
F I G. 4 (f)
THERMAL PROCESSING
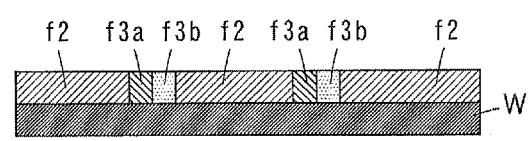
F I G. 4 (g)
ETCHING PROCESSING
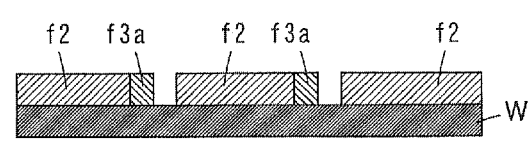

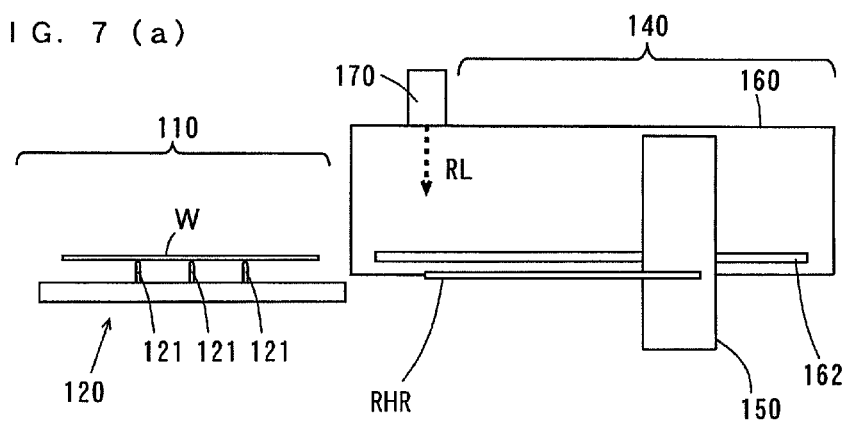
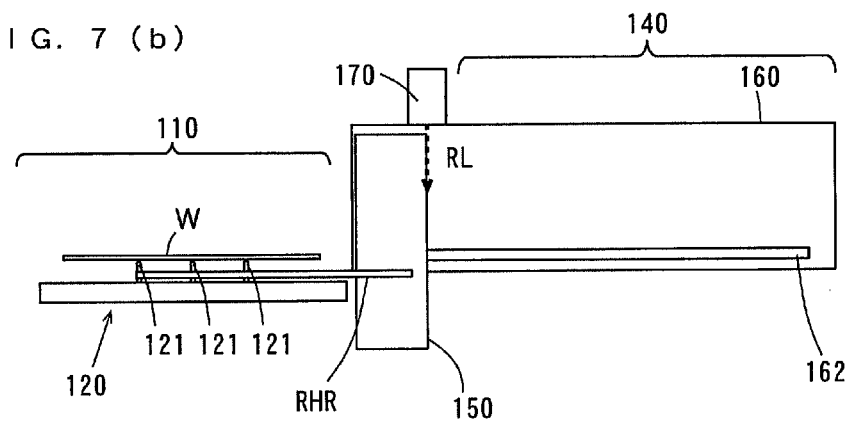
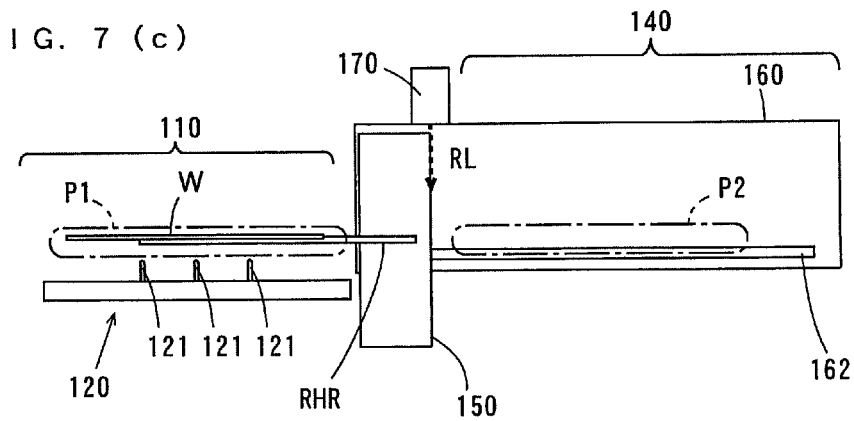

EXPOSURE DEVICE, SUBSTRATE PROCESSING APPARATUS, METHOD FOR EXPOSING SUBSTRATE AND SUBSTRATE PROCESSING METHOD

BACKGROUND OF THE INVENTION (1) Field of the Invention

The present invention relates to an exposure device which performs exposure processing on the substrate, a substrate processing apparatus, a method for exposing a substrate and a substrate processing method.

(2) Description of Related Art

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing.

Such a substrate processing apparatus generally subjects a single substrate to a plurality of different types of processing successively. The substrate processing apparatus as described in JP 2003-324139 A is constituted by an indexer block, an anti-reflection film processing block, a resist film processing block, a development processing block, and an interface block. A stepper, which is an external device separate from the substrate processing apparatus, is arranged adjacent to the interface block.

In the above-mentioned substrate processing apparatus, a substrate carried out of the indexer block is transferred to the stepper through the interface block after being subjected to anti-reflection film formation and resist film coating processing in the anti-reflection film processing block and the resist film processing block. After the resist film on the substrate is subjected to exposure in a predetermined pattern in the stepper, the substrate is transferred to the development processing block through the interface block. After development processing is performed on the resist film on the substrate in the development processing block such that the resist film having a predetermined pattern is formed, the substrate is transferred to the indexer block.

BRIEF SUMMARY OF THE INVENTION

In recent years, in the new photolithographic technique that has been developed for making patterns finer, processing for exposing one surface of a substrate on which a resist film having a predetermined pattern is formed has been examined. The use of the conventional stepper is considered for such exposure processing. However, the stepper has a complicated configuration and is high in cost.

An object of the present invention is to provide an exposure device, a substrate processing apparatus, a method for exposing a substrate and a substrate processing method which are capable of exposing a photosensitive film formed on one surface of the substrate with a simple configuration and at low cost.

(1) According to one aspect of the present invention, an exposure device that exposes a substrate includes a holder that holds a substrate having one surface on which a photosensitive film having a predetermined pattern is formed, a light emitter that emits light for modifying the photosensitive film, and a relative mover that is configured to move at least one of the holder and the light emitter relative to the other such that the one surface of the substrate held by the holder is irradiated with the light emitted by the light emitter.

In the exposure device, the one surface of the substrate held by the holder is irradiated with the light emitted from the light emitter while at least one of the holder and the light emitter is being moved relative to the other by the relative mover. Thus, the photosensitive film that is formed on the one surface of the substrate is modified by the light emitted from the light emitter.

In this case, a complicated optical mechanism for performing exposure in a fine pattern on the photosensitive film on the substrate is unnecessary. Therefore, the photosensitive film that is formed on the one surface of the substrate can be exposed with a simple configuration and at low cost.

(2) The light emitter may be configured to be capable of emitting strip-shaped light that extends in a direction intersecting a relative moving direction of the at least one f the holder and the light emitter.

In this case, the one surface of the substrate held by the holder is scanned with the strip-shaped light. Thus, the photosensitive film formed on the one surface of the substrate can be effectively exposed.

(3) The light emitter may be arranged so as to emit the light to a space between a first position and a second position that are spaced apart from each other, and the relative mover may be configured to move the holder that holds the substrate between the first position and the second position.

In this case, the holder that holds the substrate is moved between the first position and the second position, whereby the substrate is irradiated with the light emitted from the light emitter without a movement of the light emitter. Thus, the photosensitive film on the one surface of the substrate can be exposed during the transfer of the substrate. As a result, throughput of the substrate processing is improved.

(4) The relative mover may be configured to move the holder holding the substrate back and forth between the first position and the second position, and the light emitter may emit the light while the holder holding the substrate is moved from the first position to the second position and from the second position to the first position.

In this case, the one surface of the substrate can be irradiated with the sufficient amount of light while the holder holding the substrate is moved back and forth between the first position and the second position.

(5) The exposure device may further include a supporter that supports the substrate at the first position or the second position, and a processing mechanism that performs predetermined processing on the substrate supported by the supporter.

In this case, the exposure of the photosensitive film on the one surface of the substrate and the processing for the substrate can be successively performed. As a result, throughput of the substrate processing is further improved.

(6) The processing mechanism may include a temperature processor that performs temperature processing on the substrate supported by the supporter.

In this case, the exposure of the photosensitive film on the one surface of the substrate and the temperature processing for the substrate can be successively performed. As a result, throughput of the substrate processing is further improved.

(7) The temperature processor may include a heating processor that performs heating processing as the temperature processing on the substrate supported by the supporter.

In this case, the exposure of the photosensitive film on the one surface of the substrate and the heating processing for the substrate can be successively performed. The photosensitive film formed on the one surface of the substrate is modified by the heating processing. Thus, the photosensitive film formed on the one surface of the substrate is modified by two types of methods uniformly and in a short time.

(8) The temperature processor may include a cooling processor that performs cooling processing as the temperature processing on the substrate supported by the supporter.

In this case, the exposure of the photosensitive film on the one surface of the substrate and the cooling processing for the substrate can be successively performed. As a result, throughput of the substrate processing is further improved.

(9) The cooling processor may be configured to perform the cooling processing on the substrate that has been irradiated with the light emitted by the light emitter.

Thus, when a temperature of the substrate rises due to the exposure of the photosensitive film, a temperature of the substrate after the exposure can be quickly lowered. As a result, subsequent processing can be performed on the substrate after the exposure without waiting time.

(10) The exposure device may further include a first temperature processor that is provided at the first position, has a contact surface with which the holder can come into contact and performs first temperature processing on the substrate held by the holder while the holder is in contact with the contact surface, a second temperature processor that is configured to be capable of supporting the substrate at the second position and performs second temperature processing on the substrate, and an interface mechanism for receiving and transferring the substrate between the holder and the second temperature processor, wherein the relative mover may be configured to move the holder to the first position such that the holder holding the substrate comes into contact with the contact surface of the first temperature processor.

In this case, the holder is moved to the first position by the relative mover such that the holder holding the substrate comes into contact with the contact surface of the first temperature processing device. At the first position, the holder comes into contact with the contact surface of the first temperature processor, so that the first temperature processing is performed on the substrate held by the holder.

In the second position, the substrate is received/transferred between the holder and the second temperature processor by the interface mechanism. The second temperature processing is performed on the substrate supported by the second temperature processor.

Thus, the holder holding the substrate is moved between the first position and the second position, whereby the first temperature processing for the substrate, the exposure of the photosensitive film on the one surface of the substrate and the second temperature processing for the substrate can be successively performed. As a result, throughput of the substrate processing is further improved.

Further, the holder comes into contact with the contact surface of the first temperature processor at the first position, whereby a temperature of the holder is adjusted.

(11) The first temperature processor may include a cooling processor that performs cooling processing as the first temperature processing on the substrate held by the holder, and the second temperature processor may include a heating processor that performs heating processing as the second temperature processing on the substrate supported by the second temperature processor.

In this case, when the substrate held by the holder is moved from the first position to the second position, the exposure of the photosensitive film on the one surface of the substrate and the heating processing for the substrate can be successively performed. The photosensitive film formed on the one surface of the substrate is modified by the heating processing. Thus, the photosensitive film formed on the one surface of the substrate is modified by the two types of methods uniformly and in a short time.

On the other hand, when the substrate held by the holder is moved from the second position to the first position, the exposure of the photosensitive film on the one surface of the substrate and the cooling processing for the substrate can be successively performed. Thus, when a temperature of the substrate rises due to the exposure of the photosensitive film, a temperature of the substrate after the exposure can be quickly lowered. As a result, subsequent processing can be performed on the substrate after the exposure without waiting time.

Further, the holder comes into contact with the contact surface of the first temperature processor at the first position, so that the holder is cooled. Thus, when a temperature of the holder rises due to the exposure of the photosensitive film, remaining heat in the holder is removed. Therefore, thermal conduction from the holder to the substrate due to the exposure of the photosensitive film is prevented.

As a result, the photosensitive film is uniformly modified and throughput of the substrate processing is further improved while non-uniformity of a temperature of the photosensitive film due to the thermal conduction from the holder is prevented.

(12) The exposure device may further include a temperature processing mechanism that performs temperature processing on the substrate held by the holder.

In this case, the temperature processing mechanism performs the temperature processing on the substrate held by the holder. Thus, the temperature processing for the substrate can be performed while the exposure of the photosensitive film on the one surface of the substrate is performed. As a result, throughput of the substrate processing is further improved.

(13) According to another aspect of the present invention, a substrate processing apparatus includes the exposure device described above, and a processing section that performs predetermined processing on the substrate before or after exposure by the exposure device.

In the substrate processing apparatus, the processing section performs a predetermined processing on the substrate before or after the exposure by the exposure device described above. The exposure device described above enables the photosensitive film formed on the one surface of the substrate to be exposed with a simple configuration and at low cost. Thus, the substrate processing apparatus is prevented from being complicated and an increase in manufacturing cost of the substrate processing apparatus is suppressed.

(14) The processing section may include a first processing liquid coating device that applies a first processing liquid that is insoluble in a development liquid to one surface of the substrate, on which the photosensitive film is formed, before or after the exposure by the exposure device.

In this case, the exposure of the photosensitive film on the one surface of the substrate and the application of the first processing liquid that is insoluble in the development liquid are successively performed in the substrate processing apparatus.

(15) The processing section may further include a development device that performs development processing on the substrate after the exposure by the exposure device and application of the first processing liquid by the first processing liquid coating device.

In this case, because the first processing liquid is insoluble in the development liquid, only the photosensitive film is removed by the development liquid during the development processing. This causes an opening having the same pattern as the photosensitive film to be formed in the film of the first processing liquid on the one surface of the substrate. This substrate processing apparatus allows the exposure of the photosensitive film on the one surface of the substrate, the application of the first processing liquid and the development to be successively performed.

(16) The processing section may further include a second processing liquid coating device that applies a second processing liquid including a directed self assembly material on the one surface of the substrate after the development processing by the development processing device.

In this case, the second processing liquid is applied on the one surface of the substrate. The second processing liquid includes the directed self assembly material. This causes two types of polymers to be formed by microphase separation in the opening in the film of the first processing liquid on the one surface of the substrate. As a result, by removing one of the two types of polymers, a pattern of the polymer having a smaller line width than a pattern of the photosensitive film can be formed on the one surface of the substrate. Further, an opening in the polymer having a smaller line width than the pattern of the photosensitive film can be formed on the one surface of the substrate. The substrate processing apparatus allows the exposure of the photosensitive film on the one surface of the substrate, the application of the first processing liquid, the development and the application of the second processing liquid to be successively performed.

(17) According to yet another aspect of the present invention, a method for exposing a substrate includes the steps of holding the substrate having one surface on which a photosensitive film having a predetermined pattern is formed by a holder, emitting light for modifying the photosensitive film from a light emitter, and moving at least one of the holder and the light emitter relative to the other such that the one surface of the substrate held by the holder is irradiated with the light emitted by the light emitter.

In the exposure method, the one surface of the substrate held by the holder is irradiated with the light emitted from the light emitter while at least one of the holder and the light emitter is being moved relative to the other. Thus, the photosensitive film formed on the one surface of the substrate is modified by the light emitted from the light emitter.

In this case, a complicated optical mechanism for performing the exposure in a fine pattern on the photosensitive film on the substrate is unnecessary. Therefore, the photosensitive film formed on the one surface of the substrate can be exposed with a simple configuration and at low cost.

(18) According to yet another aspect of the present invention, a substrate processing method using a substrate processing apparatus includes the step of performing predetermined processing on the substrate before or after exposure by the exposure method described above.

In the substrate processing method, predetermined processing is performed on the substrate before or after the exposure by the exposure method described above. The exposure method described above enables the photosensitive film formed on the one surface of the substrate to be exposed with a simple configuration and at low cost. Therefore, the substrate processing apparatus is prevented from being complicated and an increase in the manufacturing cost of the substrate processing apparatus is suppressed.

(19) The step of performing the predetermined processing may include a step of performing temperature processing on the substrate before or after the exposure by the exposure method described above.

In this case, the temperature processing is performed on the substrate before or after the exposure by the exposure method described above. Thus, a temperature of the substrate and the photosensitive film on the one surface of the substrate before or after the exposure by the exposure method is adjusted to a desired temperature.

(20) The step of performing the predetermined processing may include a step of applying a first processing liquid that is insoluble in a development liquid to the one surface of the substrate, on which the photosensitive film is formed, before or after the exposure by the exposing method.

In this case, the exposure of the photosensitive film on the one surface of the substrate and the application of the first processing liquid that is insoluble in the development liquid are successively performed in the substrate processing apparatus.

(21) The step of performing the predetermined processing may further include a step of performing development processing on the substrate after the exposure by the exposure method and application of the first processing liquid.

In this case, because the first processing liquid is insoluble in the development liquid, only the photosensitive film is removed by the development liquid during the development processing. Thus, an opening having the same pattern as the pattern of the photosensitive film is formed in the film of the first processing liquid on the one surface of the substrate. This substrate processing method allows the exposure of the photosensitive film on the one surface of the substrate, the application of the first processing liquid and the development to be successively performed.

(22) The step of performing the predetermined processing may further include a step of applying a second processing liquid including a directed self assembly material on the one surface of the substrate after the development processing.

In this case, the second processing liquid is applied on the one surface of the substrate. The second processing liquid includes the directed self assembly material. Thus, two types of polymers are formed by microphase separation in the opening in the film of the first processing liquid on the one surface of the substrate. As a result, by removing one of the two types of the polymers, a pattern of polymer having a smaller line width than a pattern of the photosensitive film can be formed on the one surface of the substrate. Further, an opening in the polymer having a smaller line width than a pattern of the photosensitive film can be formed on the one surface of the substrate. This substrate processing method allows the exposure of the photosensitive film on the one surface of the substrate, the application of the first processing liquid, the development and the application of the second processing liquid to be successively performed.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIGS. 4(a) to 4(g) are schematic views showing a processing method for a substrate according to the first embodiment;

FIGS. 7(a) to 7(c) are diagrams for explaining the operation of the entire region exposure unit;

DESCRIPTION OF THE PREFERRED EMBODIMENTS

First Embodiment

An exposure device, a substrate processing apparatus, a method for exposing a substrate and a substrate processing method according to the first embodiment will be described below with reference to the drawings. In the following description, a substrate refers to a semiconductor substrate, a substrate for a liquid crystal display, a substrate for a plasma display, a glass substrate for a photomask, a substrate for an optical disc, a substrate for a magnetic disc, a substrate for a magneto-optical disc, a substrate for a photomask or the like.

(1) Configuration of the Substrate Processing Apparatus

Figure 1:
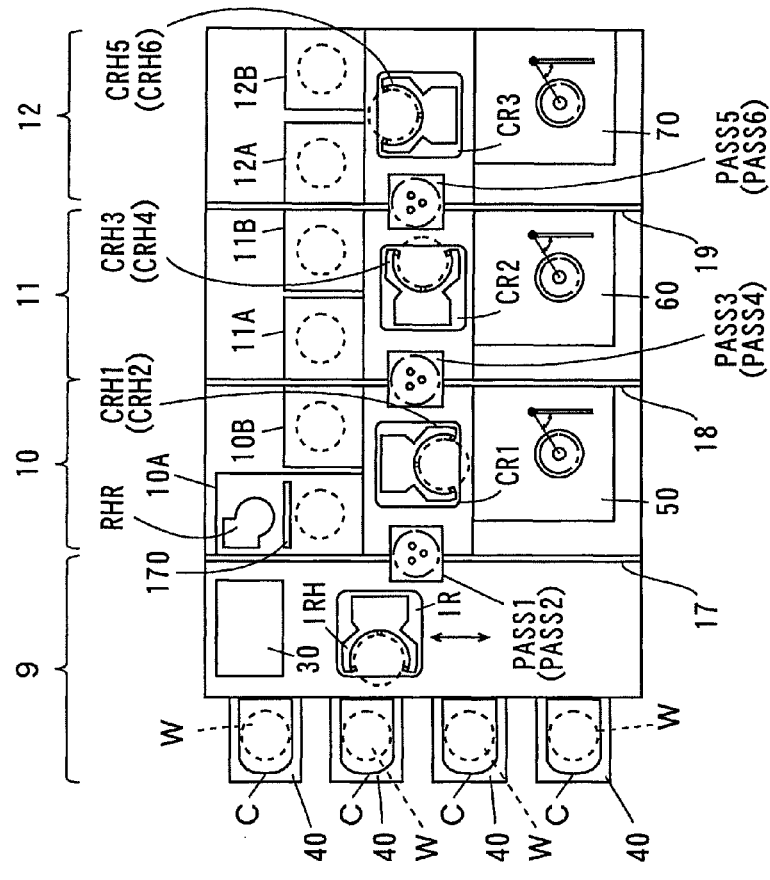
FIG. 1 is a plan view of a substrate processing apparatus according to the first embodiment.

FIG. 1 is a plan view of the substrate processing apparatus according to the first embodiment. FIG. 1 and FIGS. 2 to 4, FIGS. 9 to 12 described below are accompanied by the arrows that indicate X, Y, and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 500 includes an indexer block 9, a first processing block 10, a second processing block 11 and a third processing block 12. The indexer block 9 includes a main controller (controller) 30, a plurality of carrier platforms 40 and an indexer robot IR. The main controller 30 controls the operation of the indexer block 9, the first processing block 10, the second processing block 11 and the third processing block 12. The indexer robot IR is provided with a hand IRH for receiving and transferring each substrate W.

The first processing block 10 includes an entire region exposure processing section 10A, a thermal processing section 10B for an intermediate film, a coating processing section 50 for an intermediate film and a first central robot CR1. The coating processing section 50 is provided to be opposite to the entire region exposure processing section 10A and the thermal processing section 10B with the first central robot CR1 sandwiched therebetween. The first central robot CR1 has hands CRH1, CRH2 provided one above the other for receiving and transferring the substrate W.

A partition wall 17 for shielding an atmosphere is provided between the indexer block 9 and the first processing block 10. The partition wall 17 has substrate platforms PASS1, PASS2 provided in close proximity of one above the other for receiving and transferring the substrate W between the indexer block 9 and the first processing block 10. The upper substrate platform PASS1 is used in transferring the substrate W from the indexer block 9 to the first processing block 10, and the lower substrate platform PASS2 is used in transferring the substrate W from the first processing block 10 to the indexer block 9.

Each of the substrate platforms PASS1, PASS2 is provided with an optical sensor (not shown) that detects presence or absence of the substrate W. This allows determination whether or not the substrate W is placed on the substrate platforms PASS1, PASS2. Furthermore, each of the substrate platforms PASS1, PASS2 is provided with a plurality of support pins secured thereto. Note that each of substrate platforms PASS3 to PASS6 described below is similarly provided with the optical sensor and the support pins described above.

The second processing block 11 includes thermal processing sections 11A, 11B for development, a development processing section 60 and a second central robot CR2. The development processing section 60 is provided to be opposite to the thermal processing sections 11A, 11B with the second central robot CR2 sandwiched therebetween. The second central robot CR2 has hands CRH3, CRH4 provided one above the other for receiving and transferring the substrate W.

A partition wall 18 for shielding the atmosphere is provided between the first processing block 10 and the second processing block 11. The partition wall 18 has substrate platforms PASS3, PASS4 provided in close proximity of one above the other for receiving and transferring the substrate W between the first processing block 10 and the second processing block 11. The upper substrate platform PASS3 is used in transferring the substrate W from the first processing block 10 to the second processing block 11, and the lower substrate platform PASS4 is used in transferring the substrate W from the second processing block 11 to the first processing block 10.

A third processing block 12 includes thermal processing sections 12A, 12B for a directed self assembly (DSA) material film, a coating processing section 70 for a DSA film and a third central robot CR3. The coating processing section 70 is provided to be opposed to the thermal processing sections 12A, 12B with the third central robot CR3 sandwiched therebetween. The third central robot CR3 has hands CRH5, CRH6 provided one above the other for receiving and transferring the substrate W.

A partition wall 19 for shielding the atmosphere is provided between the second processing block 11 and the third processing block 12. The partition wall 19 has substrate platforms PASS5, PASS6 provided in close proximity of one above the other for receiving and transferring the substrate W between the second processing block 11 and the third processing block 12. The upper substrate platform PASS5 is used in transferring the substrate W from the second processing block 11 to the third processing block 12, and the lower substrate platform PASS6 is used in transferring the substrate W from the third processing block 12 to the second processing block 11.

In the present embodiment, the substrate W on which a resist film f1a (see FIG. 4(a) described below) having a predetermined pattern is formed is carried in the substrate processing apparatus 500. In the following description, a main surface of the substrate W refers to a surface on which the resist film f1a (FIG. 4(a)) is formed, and a back surface of the substrate W refers to the other surface of the substrate W on the opposite side. Inside of the substrate processing apparatus 500 according to the present embodiment, the substrate W is subjected to various processing with the main surface directed upward.

Figure 2:
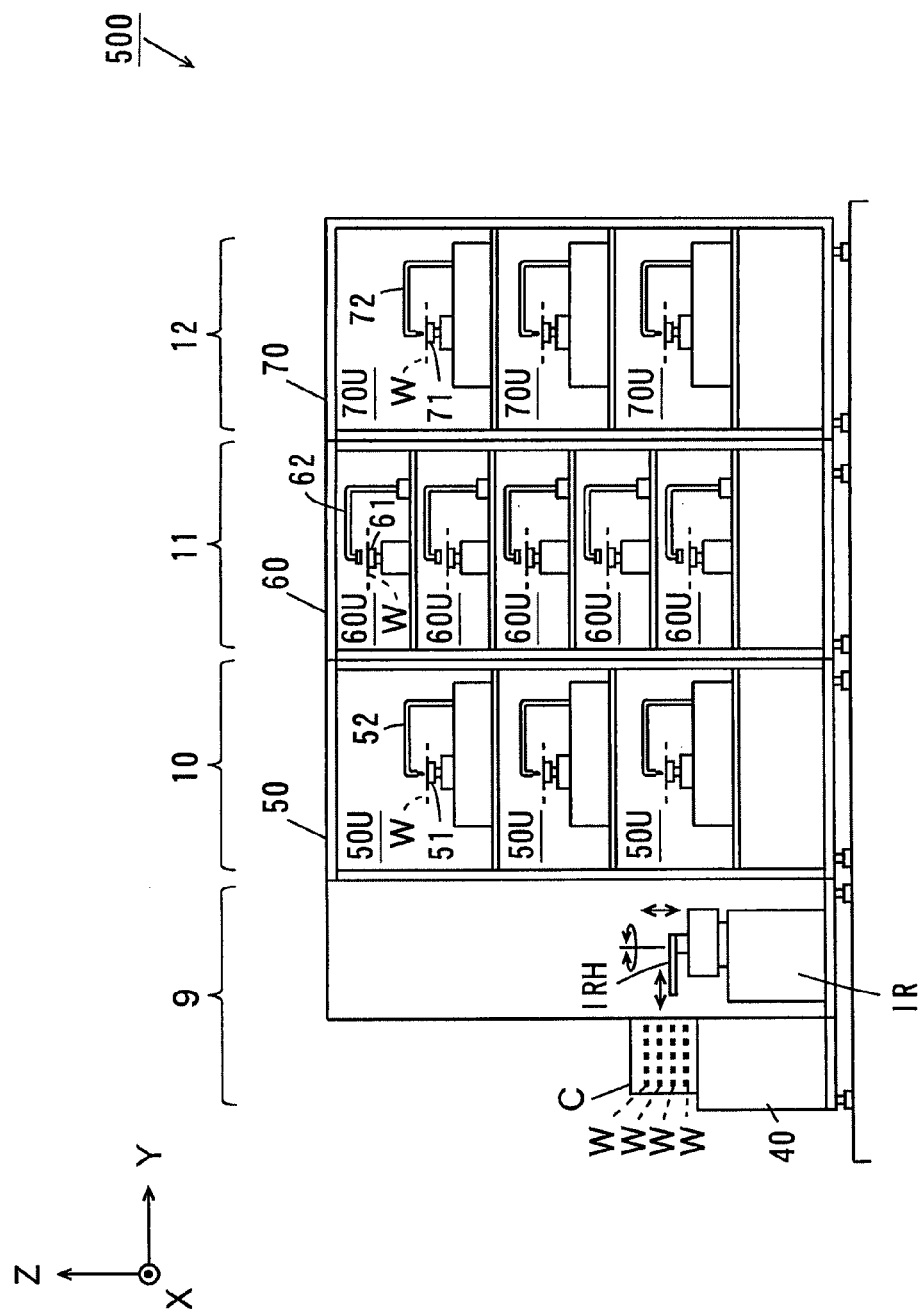
FIG. 2 is a schematic side view of the one side of the substrate processing apparatus of FIG. 1.
Figure 3:
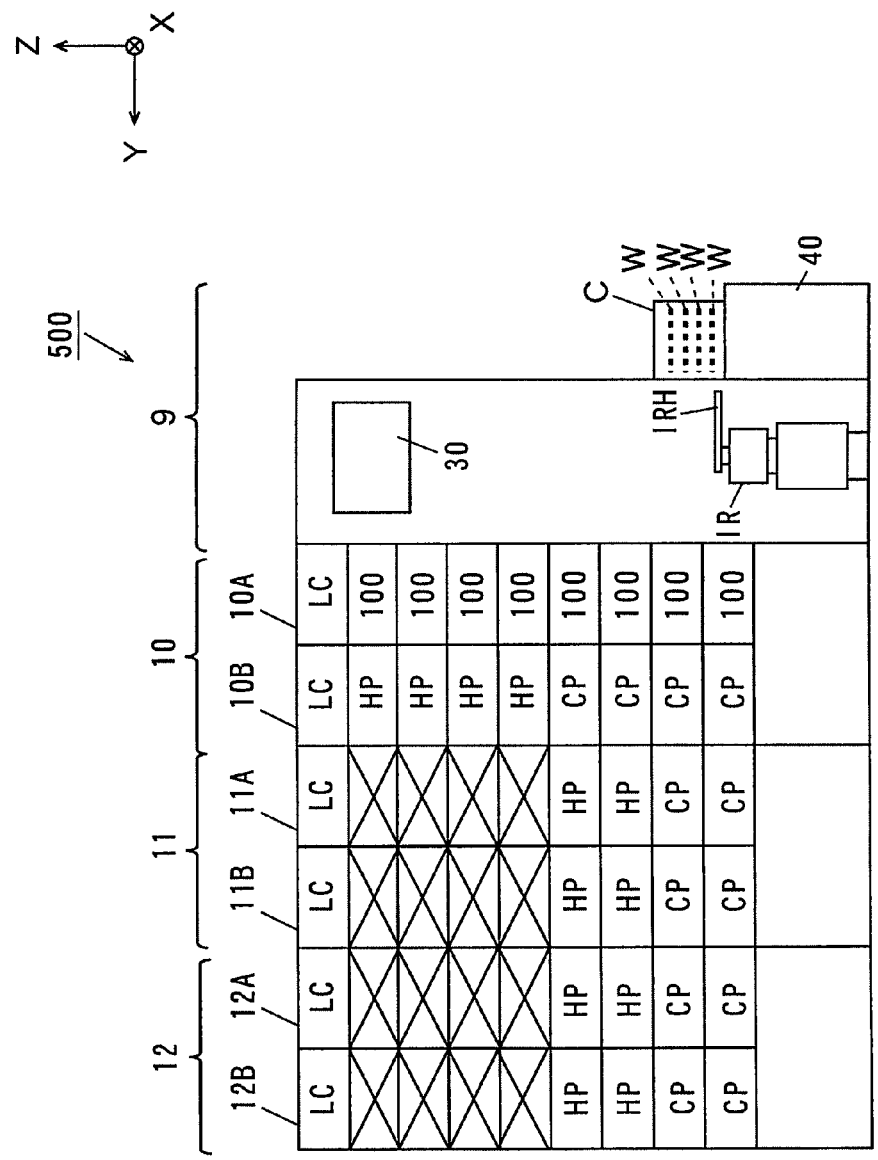
FIG. 3 is a schematic side view of the other side of the substrate processing apparatus of FIG. 1.

FIG. 2 is a schematic side view of one side of the substrate processing apparatus 500 of FIG. 1, and FIG. 3 is a schematic side view of the other side of the substrate processing apparatus 500 of FIG. 1. FIG. 2 mainly shows the configuration provided on the one side of the substrate processing apparatus 500, and FIG. 3 mainly shows the configuration provided on the other side of the substrate processing apparatus 500.

First, the configuration of the substrate processing apparatus 500 will be described using FIG. 2. As shown in FIG. 2, the coating processing section 50 in the first processing block 10 (FIG. 1) has a vertical stack of three coating units 50U. Each coating unit 50U includes a spin chuck 51 that rotates while holding the substrate W in a horizontal attitude by suction and a supply nozzle 52 that supplies a coating liquid for the intermediate film (hereinafter referred to as an intermediate liquid) to the substrate W held on the spin chuck 51. In the present embodiment, the intermediate liquid is a processing liquid that is insoluble in a development liquid.

The development processing section 60 in the second processing block 11 (FIG. 1) has the vertical stack of five development liquid supply units 60U. Each development liquid supply unit 60U includes a spin chuck 61 that rotates while holding the substrate W in a horizontal attitude by suction and a supply nozzle 62 that supplies the development liquid to the substrate W held on the spin chuck 61.

The coating processing section 70 in the third processing block 12 (FIG. 1) has the vertical stack of three coating units 70U. Each coating unit 70U includes a spin chuck 71 that rotates while holding the substrate W in a horizontal attitude by suction and a supply nozzle 72 that supplies a coating liquid for a DSA film (hereinafter referred as a DSA liquid) to the substrate W held on the spin chuck 71.

Next, the configuration of the substrate processing apparatus 500 will be described using FIG. 3. As shown in FIG. 3, the entire region exposure processing section 10A in the first processing block 10 has the vertical stack of eight entire region exposure units 100. Each entire region exposure unit 100 includes a light-emitting device 170 (FIG. 1) that emits light RL (see FIG. 4(b) described below) for modifying the resist film f1a (see FIG. 4(a) described below) previously formed on the main surface of the substrate W. Further, the entire region exposure unit 100 includes a local transfer hand RHR (FIG. 1) that holds the substrate W. Furthermore, the entire region exposure unit 100 includes a local transfer mechanism 140 (FIG. 5 described below) that moves the local transfer hand RHR relative to the light-emitting device 170. The details of the entire region exposure unit 100 will be described below.

The thermal processing section 10B in the first processing block 10 has the vertical stack of four heating units HP and four cooling units CP. The entire region exposure processing section 10A has a local controller LC arranged in its uppermost portion for controlling the operation of the entire region exposure units 100. The thermal processing section 10B has the local controller arranged in its uppermost portion for controlling the respective temperatures of the heating units HP and the cooling units CP.

Each thermal processing sections 11A, 11B in the second processing block 11 has the vertical stack of the two heating units HP and the two cooling units CP. The thermal processing section 11A, 11B has the local controller LC arranged in its uppermost portion for controlling the respective temperatures of the heating units HP and the cooling units CP.

Each thermal processing section 12A, 12B in the third processing block 12 has the vertical stack of the two heating units HP and the two cooling units CP. Further, the thermal processing sections 12A, 12B has the local controller LC arranged its uppermost portion for controlling the respective temperatures of the heating units HP and the cooling units CP.

(2) Operation of the Substrate Processing Apparatus and the Method for Processing the Substrate The operation of the substrate processing apparatus 500 and the method for processing the substrate W according to the present embodiment will be then described with reference to FIGS. 1 to 4. FIGS. 4(a) to 4(g) are schematic views showing the method for processing the substrate W according to the first embodiment. FIGS. 4(a) to 4(g) show states of the substrate W, that change every time processing is performed, in cross sectional views.

Carriers C are carried onto the carrier platforms 40 in the indexer block 9. The plurality of substrates W are stored in multiple stages of each carrier C carried in the substrate processing apparatus 500. When the carriers C are carried in the substrate processing apparatus 500, the resist film f1a in a predetermined pattern is formed on the main surface of each substrate W as shown in FIG. 4(a). In the present embodiment, the state of the substrate W shown in FIG. 4(a) is referred to as an initial state. The resist film f1a is previously formed using a photolithography technique by another substrate processing apparatus.

The indexer robot IR takes out any one of the substrates W in the initial state that is stored in any one of the carriers C using the hand IRH. Thereafter, the indexer robot IR rotates around the shaft parallel with the Z direction while moving in the X direction, to place the substrate W in the initial state on the substrate platform PASS1.

The substrate W in the initial state placed on the substrate platform PASS1 is received by the first central robot CR1 in the first processing block 10. The first central robot CR1 carries the substrate W into the entire region exposure processing section 10A. As shown in FIG. 4(b), in the entire region exposure processing section 10A, the entire region on the main surface of the substrate W is irradiated by the entire region exposure unit 100 with the light RL for modifying the resist film f1a (entire region exposure processing). In the present embodiment, ultra violet rays are used as the light RL for modifying the resist film f1a. In FIG. 4(b), and FIG. 4(c) described below, the modified resist film is indicated by the symbol f1b.

Thereafter, the first central robot CR1 takes out the substrate W after the entire region exposure processing from the entire region exposure processing section 10A and carries the substrate W into the thermal processing section 10B. Then, the first central robot CR1 takes out the thermally processed substrate W from the thermal processing section 10B and carries the substrate W into the coating processing section 50. In the coating processing section 50, the intermediate liquid insoluble in the development liquid is applied to the main surface of the substrate W by any one of the coating units 50U (intermediate liquid coating processing). Thus, the intermediate liquid insoluble in the development liquid is supplied on a region of the main surface of the substrate W where the resist f1b is not formed.

The first central robot CR1 then takes out the substrate W after the intermediate liquid coating processing from the coating processing section 50 and carries the substrate W into the thermal processing section 10B. The thermal processing is performed by the thermal processing section 10B such that the intermediate liquid is cured and an intermediate film f2 is formed as shown in FIG. 4(c). Thereafter, the first central robot CR1 takes out the thermally processed substrate W from the thermal processing section 10B and places the substrate W on the substrate platform PASS3.

The substrate W placed on the substrate platform PASS3 is received by the second central robot CR2 in the second processing block 11. The second central robot CR2 carries the substrate W into the development processing section 60. In the development processing section 60, the development processing is performed on the substrate W after the entire region exposure processing and formation of the intermediate film f2. In this case, because the intermediate film f2 is insoluble in the development liquid, only the modified resist film f1b is removed by the development liquid. Therefore, as shown in FIG. 4(d), an opening having the same pattern as the resist film f1b of FIG. 4(c) is formed in the intermediate film f2.

The second central robot CR2 then takes out the substrate W after the development processing from the development processing section 60 and carries the substrate W into one of the thermal processing sections 11A, 11B. Thereafter, the second central robot CR2 takes out the thermally processed substrate W from one of the thermal processing sections 11A, 11B and places the substrate W on the substrate platform PASS5.

The substrate W placed on the substrate platform PASS5 is received by the third central robot CR3 in the third processing block 12. The third central robot CR3 carries the substrate W into one of the thermal processing sections 12A, 12B. Next, the third central robot CR3 takes out the thermally processed substrate W from one of the thermal processing sections 12A, 12B and carries the substrate W into the coating processing section 70. In the coating processing section 70, the DSA liquid is applied to the main surface of the substrate W by any one of the coating units 70U (DSA liquid coating processing). Therefore, as shown in FIG. 4(e), a DSA liquid f3 is supplied on regions of the main surface of the substrate W where the intermediate film f2 is not formed. The DSA liquid f3 includes two types of polymeric components having different qualities (hydrophilic macromolecule and hydrophobic macromolecule). Therefore, after the coating processing of the DSA liquid, a microphase separation occurs in the DSA liquid f3 on the regions of the main surface of the substrate W where the intermediate film f2 is not formed. A first polymer and a second polymer are produced by the microphase separation.

The third central robot CR3 then takes out the substrate W after the DSA liquid coating processing from the coating processing section 70 and carries the substrate W into one of the thermal processing sections 12A, 12B. As shown in FIG. 4(f), the thermal processing is performed by one of the thermal processing sections 12A, 12B such that a first polymer f3a and a second polymer f3b are formed on regions of the main surface of the substrate W where the intermediate film f2 is not formed.

Thereafter, the third central robot CR3 takes out the thermally processed substrate W from one of the thermal processing sections 12A, 12B and places the substrate W on the substrate platform PASS6.

The substrate W placed on the substrate platform PASS6 is received by the second central robot CR2 in the second processing block 11. The second central robot CR2 places the substrate W on the substrate platform PASS4.

The substrate W placed on the substrate platform PASS4 is received by the first central robot CR1 in the first processing block 10. The first central robot CR1 places the substrate W on the substrate platform PASS2.

The substrate W placed on the substrate platform PASS2 is stored in the carrier C by the indexer robot IR in the indexer block 9. Each processing for the substrate W in the substrate processing apparatus 500 is thus completed.

Each carrier C storing the processed substrate W by the substrate processing apparatus 500 is transferred to yet another substrate processing apparatus that performs the subsequent steps on the substrate W. In the yet another substrate processing apparatus, as shown in FIG. 4(g), only one of the first polymer f3a and the second polymer f3b (the second polymer f3b in FIG. 4(g)) is removed by an etching device. Thus, a pattern of the first polymer f3a having a smaller line width than that of the pattern of the resist film f1a of FIG. 4(a) can be formed on the main surface of the substrate W. Further, an opening formed by removing the second polymer f3b having a smaller line width than that of the pattern of the resist film f1a of FIG. 4(a) can be formed on the main surface of the substrate W. In such a manner, a finer exposure pattern can be realized. Ion implantation, for example, is performed in the opening in the main surface of the substrate W.

(3) Entire Region Exposure Unit

Figure 5:
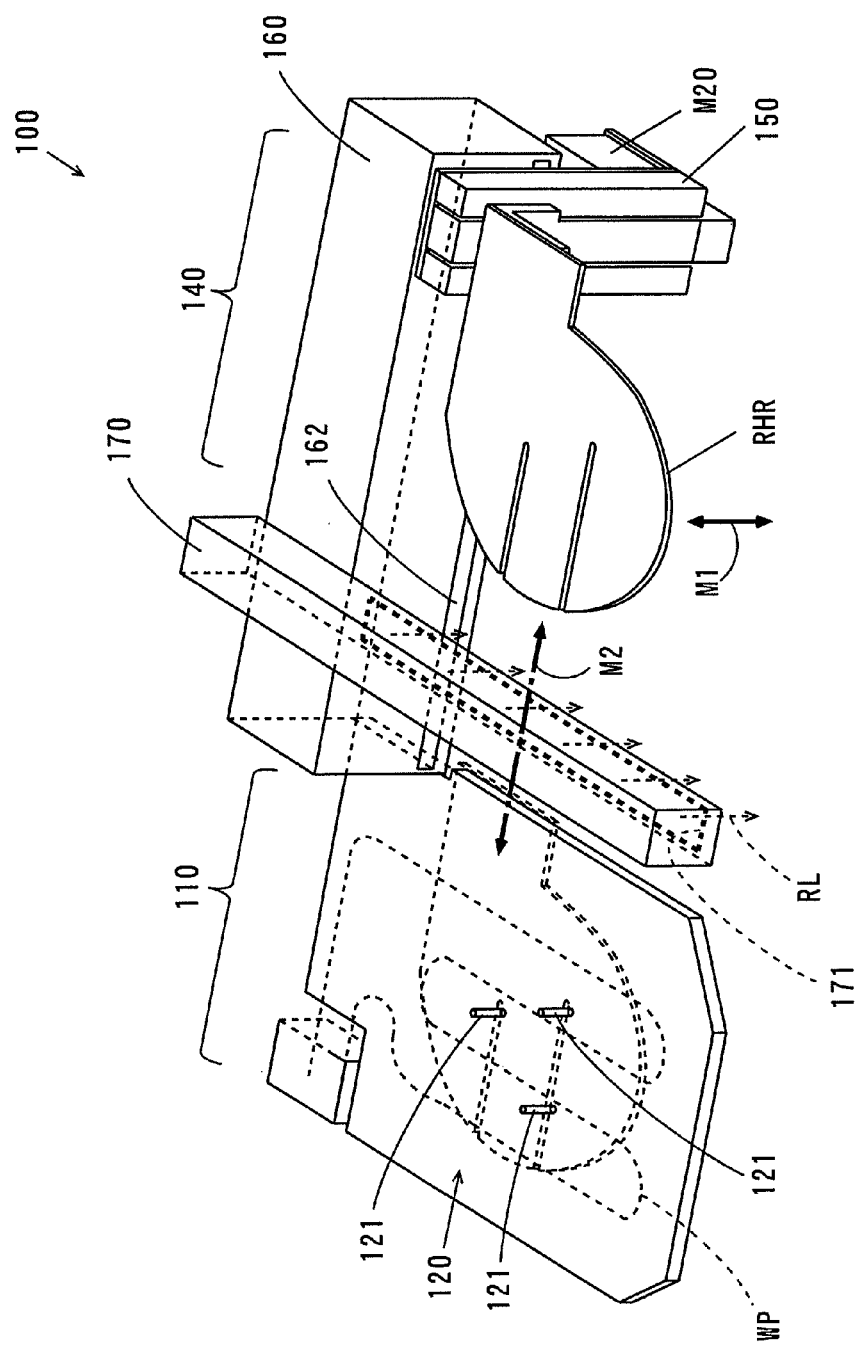
FIG. 5 is an external perspective view of an entire region exposure unit of FIG. 3.

The entire region exposure unit 100 will be then described in detail with reference to the drawings. FIG. 5 is an external perspective view of the entire region exposure unit 100 of FIG. 3, and FIG. 6 is a schematic cross sectional view of the entire region exposure unit 100 of FIG. 3.

Figure 6:
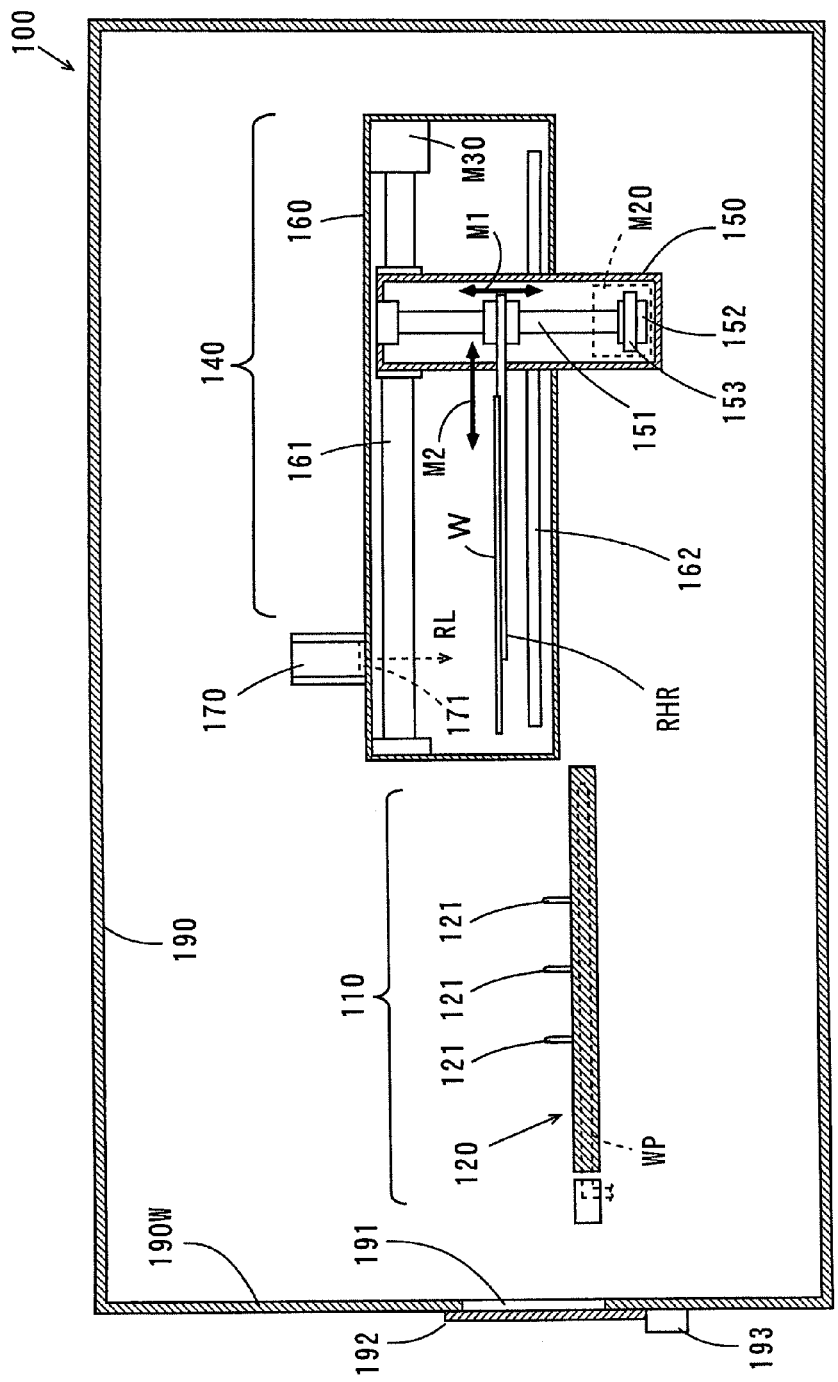
FIG. 6 is a schematic cross sectional view of the entire region exposure unit of FIG. 3.

As shown in FIG. 6, the entire region exposure unit 100 includes a casing 190. The casing 190 has a rectangular parallelepiped shape and an opening 191 is formed on one sidewall 190W. A shutter 192 for opening/closing the opening 191 and a shutter driver 193 for driving the shutter 192 are provided on the one sidewall 190W. The casing 190 is not shown in FIG. 5.

As shown in FIGS. 5 and 6, a platform 110, a local transfer mechanism 140 and the light-emitting device 170 are mainly provided in the casing 190.

In the entire region exposure unit 100, the platform 110 is arranged in the vicinity of the opening 191 in the casing 190. The platform 110 includes a cooling plate 120, a plurality of (three in this example) fixed support pins 121 and a water-cooled pipe WP.

The cooling plate 120 is integrally fixed to the casing 190 such that the upper surface of the cooling plate 120 is horizontal. The plurality of fixed support pins 121 are provided to project upward from the upper surface of the cooling plate 120. The water-cooled pipe WP is provided inside of the cooling plate 120. A refrigerant is circulated in the water-cooled pipe WP such that a temperature of the cooling plate 120 can be adjusted. Thus, a temperature of the substrate W supported on the plurality of the fixed support pins 121, for example, can be adjusted. Note that the water-cooled pipe WP does not have to be provided in the present embodiment.

A substrate detecting sensor (not shown) is further provided on the cooling plate 120. The presence or absence of the substrate W on the cooling plate 120 (whether or not the substrate W is placed on the platform 110) is determined based on the detection result by the substrate detecting sensor.

The local transfer mechanism 140 is arranged so as to be opposite to the opening 191 in the casing 190 with the platform 110 sandwiched therebetween. The local transfer mechanism 140 includes a first transfer casing 150, a first sending shaft 151, a pulley 152, a belt 153, a second transfer casing 160, a second sending shaft 161, a slide rail 162 and sending shaft driving motors M20, M30. The local transfer mechanism 140 is provided with the local transfer hand RHR for holding the substrate W.

The first sending shaft 151, the pulley 152 and the belt 153 are stored in the first transfer casing 150. The sending shaft driving motor M20 is attached to the lower end of the first transfer casing 150. The first sending shaft 151 is arranged so as to extend in the vertical direction. The local transfer hand RHR is connected to the first sending shaft 151. The pulley 152 is attached to the lower end of the first sending shaft 151. The belt 153 is connected to the pulley 152. The sending shaft driving motor M20 operates such that the generated rotational force is transmitted to the first sending shaft 151 through the belt 153 and the pulley 152. This causes the first sending shaft 151 to rotate, whereby the local transfer hand RHR is moved in the vertical direction (the direction of the arrow M1 of FIGS. 5 and 6).

The second sending shaft 161, the slide rail 162 and the sending shaft driving motor M30 are stored in the second transfer casing 160. The second sending shaft 161 is arranged so as to extend in the horizontal direction. Similarly, the slide rail 162 is arranged so as to extend in the horizontal direction. The first transfer casing 150 is connected to the second sending shaft 161 and the slide rail 162. The sending shaft driving motor M30 is connected to one end of the second sending shaft 161. The sending shaft driving motor M30 operates, causing the second sending shaft 161 to rotate, whereby the local transfer hand RHR is moved in the horizontal direction (the direction of the arrow M2 of FIGS. 5 and 6) together with the first transfer casing 150.

The local transfer hand RHR is moved mainly between a first position P1 (FIG. 7(c)) and a second position P2 (FIG. 7(c)) described below by the movement in the horizontal direction. The local transfer hand RHR is provided with a plurality of slits (two in this example) for not interfering with any of the fixed support pins 121.

The light-emitting device 170 is attached to the upper portion of the second transfer casing 160. The light-emitting device 170 has a long-sized emission surface 171 made of a light emitting diode (LED), for example. The emission surface 171 is larger in length than an outer diameter of the subject substrate W (300 mm, for example). The strip-shaped light RL is emitted from the emission surface 171 of the light-emitting device 170.

The light-emitting device 170 is arranged such that the light RL is emitted between the first position P1 (FIG. 7(c)) and the second position P2 (FIG. 7(c)) described below and the strip-shaped light RL crosses a horizontal moving path of the substrate W held by the local transfer hand RHR.

Figure 8:
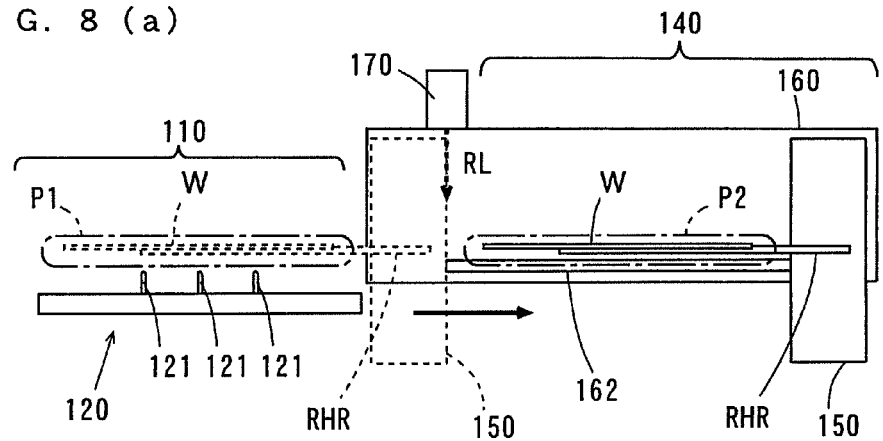
FIGS. 8(a) and 8(b) are diagrams for explaining the operation of the entire region exposure unit.
Figure 8:
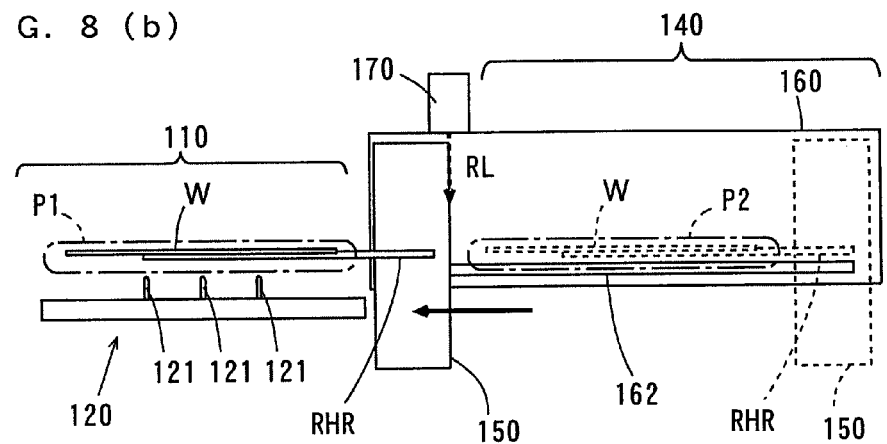

The operation of the entire region exposure unit 100 will be described. FIGS. 7 and 8 are diagrams for explaining the operation of the entire region exposure unit 100. The operation of each constituent element of the entire region exposure unit 100 described below is controlled by the local controller LC provided in the entire region exposure processing section 10A of FIG. 3. Note that the operation of each constituent element of the entire region exposure unit 100 may be controlled by the main controller 30 of FIG. 1.

In the present embodiment, the strip-shaped light RL is emitted from the light-emitting device 170 while the substrate processing apparatus 500 is turned on. Note that the strip-shaped light RL may be emitted from the emission surface 171 (FIG. 5) only from the time when the substrate W is carried into the casing 190 to the time when the substrate is carried out of the casing 190.

First, as shown in FIG. 7(a), the substrate W in the initial state (FIG. 4(a)) is carried into the entire region exposure unit 100 by the first central robot CR1 (FIG. 1) through the opening 191 (FIG. 6), and the substrate W carried in is placed on the fixed support pins 121 of the platform 110.

In this state, the sending shaft driving motors M20, M30 (FIG. 6) of the local transfer mechanism 140 operate such that a tip end of the local transfer hand RHR is inserted into the space between the cooling plate 120 and the substrate W supported on the fixed support pins 121 as shown in FIG. 7(b).

Next, as shown in FIG. 7(c), the sending shaft driving motor M20 (FIG. 6) of the local transfer mechanism 140 operates such that the local transfer hand RHR is raised to a position higher than the upper ends of the fixed support pins 121. Thus, the substrate W is received by the local transfer hand RHR.

In the entire region exposure unit 100, a first position P1 and a second position P2 are previously set. In this example, as indicated by the one-dot and dash line in FIG. 7(c), the first position P1 is set to a position slightly upper than the upper ends of the fixed support pins 121 of the platform 110. The second position P2 is set on the same level as the first position P1 and on the side of the platform 110.

Then, as shown in FIG. 8(a), the sending shaft driving motor M30 of the local transfer mechanism 140 (FIG. 6) operates such that the local transfer hand RHR holding the substrate W is moved from the first position P1 to the second position P2 in the horizontal direction.

As described above, the strip-shaped light RL emitted from the light-emitting device 170 crosses the moving path of the substrate W. In this case, the local transfer hand RHR is moved relative to the light-emitting device 170 such that the substrate W is scanned from the one side to the other side with the strip-shaped light RL. Thus, the entire region on the main surface is irradiated with the light RL, and the resist film f1a of FIG. 4(a) is modified (entire region exposure processing).

Thereafter, as shown in FIG. 8(b), the sending shaft moving motor M30 of the local transfer mechanism 140 (FIG. 6) further operates such that the local transfer hand RHR holding the substrate W is moved from the second position P2 to the first position P1 in the horizontal direction. Also in this case, the local transfer hand RHR is moved relative to the light-emitting device 170 such that the substrate W is scanned from the other side to the one side with the strip-shaped light RL. Thus, the entire region on the main surface is irradiated again with the light RL, and the resist film f1a of FIG. 4(a) is modified (entire region exposure processing).

Next, the local transfer hand RHR falls to a position lower than the upper ends of the fixed support pins 121. Therefore, as shown in FIG. 7(b), the substrate W is placed on the fixed support pins 121. In this state, the tip end of the local transfer hand RHR is drawn out of the space between the cooling plate 120 and the substrate W supported on the fixed support pins 121. Finally, the substrate W after the entire region exposure processing (FIG. 4(b)) is carried out by the first central robot CR1 (FIG. 1) through the opening 191 (FIG. 6).

In the entire region exposure unit 100 described above, the strip-shaped light RL to be irradiated by the light-emitting device 170 preferably has uniform intensity distribution, and the movement speed of the local transfer hand RHR while the main surface of the substrate W is being irradiated with the light RL is preferably constant. In this case, distribution of an amount of the light received in the main surface of the substrate W can be made uniform. Thus, the resist film f1a of FIG. 4(a) can be uniformly modified.

In the entire region exposure unit 100 described above, if the substrate W is moved from the first position P1 to the second position P2 such that the substrate W is irradiated with the sufficient amount of the light RL, the emission surface 171 of the light-emitting device 170 may be covered with a shielding member while the substrate W is being moved from the second position P2 to the first position P1.

In the platform 110 described above, the plurality of fixed support pins 121 are provided to project upward from the upper surface of the cooling plate 120. Instead, the platform 110 may have the following configuration. For example, a plurality of through holes may be formed through the cooling plate 120. Further, a plurality of movable support pins configured to be vertically movable through the plurality of through holes may be provided in the platform 110.

In this case, receiving/transferring the substrate W between the platform 110 and the hands CRH1, CRH2 of the first central robot CR1 of FIG. 1, and receiving/transferring the substrate W between the platform 110 and the local transfer hand RHR can be performed while the plurality of movable support pins are projected upward through the cooling plate 120. Further, the upper ends of the plurality of movable support pins are lowered to the level substantially equal to the upper surface of the cooling plate 120 while the substrate W is placed on the plurality of movable support pins. Thus, the substrate W can be close to the upper surface of the cooling plate 120. Further in this state, a temperature of the substrate W can be efficiently adjusted by adjusting a temperature of the cooling plate 120.

Further in the platform 110, a heating plate configured to be capable of heating the substrate W may be provided instead of the cooling plate 120. In this case, the substrate W can be heated in the platform 110.

Further, in the entire region exposure unit 100, the heating plate for heating the substrate W may be provided below the platform 110, for example. In this case, the local transfer mechanism 140 transfers the substrate W between the platform 110 and the heating plate such that the entire region exposure processing and heating processing for the substrate W can be successively performed in the entire region exposure unit 100.

(4) Effects of First Embodiment (4-1) In the entire region exposure unit 100 according to the present embodiment, the main surface of the substrate W is irradiated with the light RL emitted from the light-emitting device 170 while the local transfer hand RHR that holds substrate W is being moved relative to the light-emitting device 170 by the local transfer mechanism 140. Thus, the resist film f1a formed on the main surface of the substrate W is modified. In this case, a complicated optical mechanism for performing the exposure in a fine pattern on the resist film f1a on the substrate W is unnecessary. Therefore, the resist film f1a formed on the main surface of the substrate W can be exposed with a simple configuration and at low cost.

(4-2) In the present embodiment, the main surface of the substrate W is scanned with the strip-shaped light RL during the entire region exposure processing. Thus, the resist film f1a formed on the main surface of the substrate W is efficiently exposed.

(4-3) In the present embodiment, the resist film f1a is exposed during the transfer of the substrate W, and therefore throughput of the substrate processing is improved.

(4-4) In the present embodiment, the resist film f1a is exposed while the local transfer hand RHR is being moved from the first position P1 to the second position P2 and from the second position P2 to the first position P1, respectively. Thus, the main surface of the substrate W can be irradiated with a sufficient amount of the light RL.

[2] Second Embodiment

As for the exposure device, the substrate processing apparatus, the method for exposing the substrate and the substrate processing method according to the second embodiment, the difference from the first embodiment will be described. FIG. 9(a) is a plan view showing the substrate processing apparatus according to the second embodiment, and FIG. 9(b) is a side view taken along the line Q1 of FIG. 9(a).

In the substrate processing apparatus 500 according to the present embodiment, the first processing block 10 is provided with a thermal processing section 10H instead of the entire region exposure processing section 10A of FIG. 1. The thermal processing section 10H has a vertical stack of a plurality of temperature adjustment units 200.

As shown in FIG. 9(b), each temperature adjustment unit 200 has the configuration in which the light-emitting device 170 and the platform 220 are mainly provided in the casing 190. Similarly to the entire region exposure unit 100 of FIG. 6, the opening 191 for carrying in/out the substrate W is formed on the one sidewall of the casing 190. Further, the platform 220 has the same configuration as the platform 110 of FIGS. 5 and 6.

In the temperature adjustment unit 200, the light-emitting device 170 is arranged such that the light RL is emitted to the space between the opening of the casing 190 and the platform 220. In the present embodiment, the entire region exposure unit 100 is constituted by the temperature adjustment unit 200, the first central robot CR1 and the hands CRH1, CRH2.

In this example, the first position P1 is set outside of the casing 190, and the second position P2 is set on the platform 220 in the casing 190.

The hand CRH1 (or the hand CRH2) holding the substrate W is moved from the first position P1 to the second position P2 by the first central robot CR1 while the light RL is being emitted from the light-emitting device 170. Further, the hand CRH1 (or the hand CRH2) holding the substrate W is moved from the second position P2 to the first position P1 by the first central robot CR1 while the light RL is being emitted from the light-emitting device 170. Thus, the hand CRH1 (or the hand CRH2) holding the substrate W is moved relative to the light-emitting device 170 such that the main surface of the substrate W is scanned with the strip-shaped light RL. Thus, the resist film f1a of FIG. 4(a) is modified.

In the present embodiment, the entire region exposure processing is performed on the substrate W that is being transferred by the first central robot CR1. Therefore, a mechanism for separately transferring the substrate W from the first central robot CR1 (the local transfer mechanism 140 of FIGS. 5 and 6, for example) is unnecessary. Therefore, the entire region exposure processing can be performed on the substrate W with a simpler configuration and at low cost. As a result, the substrate processing apparatus 500 is further prevented from being complicated, an increase in size of the substrate processing apparatus 500 is further suppressed and an increase in the manufacturing cost of the substrate processing apparatus 500 is further suppressed.

[3] Third Embodiment

As for the exposure device, the substrate processing apparatus, the method for exposing the substrate and the substrate processing method according to the third embodiment, the difference from the first embodiment will be described. FIG. 10(a) is a plan view showing the substrate processing apparatus according to the third embodiment, and FIG. 10(b) is a side view taken along the line Q2 of FIG. 10(a).

In the substrate processing apparatus 500 according to the present embodiment, the light-emitting device 170 is provided in the indexer block 9. Further, the first processing block 10 is provided with a thermal processing section 10C for an intermediate film instead of the entire region exposure processing section 10A of FIG. 1. The thermal processing section 10C has the same configuration as the thermal processing section 10B of FIG. 1.

As shown in FIGS. 10(a) and 10(b), in the indexer block 9, the light-emitting device 170 is arranged such that the light RL is emitted from above to the space between the indexer robot IR and the substrate platforms PASS1, PASS2 in the Y direction. In the present embodiment, the entire region exposure unit 100 is constituted by the light-emitting device 170, the indexer robot IR and the hand IRH. In this example, the first position P1 is set substantially at the center of the indexer block 9 in the Y direction, and the second position P2 is set at the substrate platform PASS1.

The hand IRH of the indexer robot IR holding the substrate W is moved from the first position P1 to the second position P2 while the light RL is being emitted from the light-emitting device 170. In such a manner, the substrate W is moved relative to the light-emitting device 170, whereby the main surface of the substrate W is scanned with the strip-shaped light RL. Thus, the resist film f1a of FIG. 4(a) is modified.

In the present embodiment, the entire region exposure processing is performed on the substrate W that is being transferred by the indexer robot IR. Therefore, a mechanism for separately transferring the substrate W from the indexer robot IR (the local transfer mechanism 140 of FIGS. 5 and 6, for example) is unnecessary. Therefore, the entire region exposure processing can be performed on the substrate W with a simpler configuration and at low cost. As a result, the substrate processing apparatus 500 is further prevented from being complicated, an increase in size of the substrate processing apparatus 500 is further suppressed and an increase in the manufacturing cost of the substrate processing apparatus 500 is further suppressed.

In the present embodiment, the light-emitting device 170 is preferably configured to emit the light RL only while the substrate W is being moved from the first position P1 to the second position P2.

[4] Fourth Embodiment

As for the exposure device, the substrate processing apparatus, the method for exposing the substrate and the substrate processing method according to the fourth embodiment, the difference from the third embodiment will be described. FIG. 11(a) is a plan view showing the substrate processing apparatus according to the fourth embodiment, and FIG. 11(b) is a side view taken along the line Q3 of FIG. 11(a).

As shown in FIGS. 11(a) and 11(b), in the indexer block 9, the light-emitting device 170 is arranged such that the light RL is emitted from above to the space between the plurality of carrier platforms 40 and the indexer robot IR in the Y direction. In the present embodiment, the entire region exposure unit 100 is constituted by the light-emitting device 170, the indexer robot IR and the hand IRH. In this example, the first position P1 is set in the carrier C placed on each carrier platform 40, and the second position P2 is set substantially at the center of the indexer block 9 in the Y direction.

The hand IRH of the indexer robot IR holding the substrate W is moved from the first position P1 to the second position P2 and the substrate W in the initial state is carried out of the carrier C while the light RL is being emitted from the light-emitting device 170. In such a manner, the substrate W is moved relative to the light-emitting device 170 such that the main surface of the substrate W is scanned with the strip-shaped light RL. Thus, the resist film f1a of FIG. 4(a) is modified.

Also in the present embodiment, the entire region exposure processing is performed on the substrate W that is being transferred by the indexer robot IR. Therefore, a mechanism for separately transferring the substrate W from the indexer robot IR (the local transfer mechanism 140 of FIGS. 5 and 6, for example) is unnecessary. Therefore, the entire region exposure processing can be performed on the substrate W with a simpler configuration and at low cost. As a result, the substrate processing apparatus 500 is further prevented from being complicated, an increase in size of the substrate processing apparatus 500 is further suppressed and an increase in the manufacturing cost of the substrate processing apparatus 500 is further suppressed.

Also in the present embodiment, the light-emitting device 170 is preferably configured to emit the light RL only while the substrate W is being moved from the first position P1 to the second position P2.

[5] Fifth Embodiment

As for the exposure device, the substrate processing apparatus, the method for exposing the substrate and the substrate processing method according to the fifth embodiment, the difference from the third embodiment will be described. FIG. 12(a) is a plan view showing the substrate processing apparatus according to the fifth embodiment, and FIG. 12(b) is a side view taken along the line Q4 of FIG. 12(a).

In the present embodiment, as shown in FIGS. 12(a) and 12(b), an alignment device 300 for adjusting a direction and the like of the substrate W is provided in the indexer block 9. The alignment device 300 is provided with a supporter for supporting the substrate W (not shown) and an adjustment mechanism for adjusting the direction and the like of the substrate W (not shown) supported by the supporter. In the indexer robot 9, the light-emitting device 170 is arranged such that the light RL is emitted from above to the space between the alignment device 300 and the indexer robot IR in the X direction. In the present embodiment, the entire region exposure unit 100 is constituted by the light-emitting device 170, the indexer robot IR and the hand IRH. In this example, the first position P1 is set on one side of the alignment device 300 in the X direction, and the second position P2 is set in the alignment device 300.

The hand IRH of the indexer robot IR holding the substrate W is moved from the first position P1 to the second position P2 and the substrate W is carried into the alignment device 300 while the light RL is being emitted from the light-emitting device 170. Further, the hand IRH holding the substrate W is moved from the second position P2 to the first position P1 by the indexer robot IR, and the substrate W is carried out of the alignment device 300 while the light RL is being emitted from the light-emitting device 170. In such a manner, the hand IRH holding the substrate W is moved relative to the light-emitting device 170 such that the main surface of the substrate W is scanned with the strip-shaped light RL. Thus, the resist film f1a of FIG. 4(a) is modified.

Also in the present embodiment, the entire region exposure processing is performed on the substrate W that is being transferred by the indexer robot IR. Therefore, a mechanism for separately transferring the substrate W from the indexer robot IR (the local transfer mechanism 140 of FIGS. 5 and 6, for example) is unnecessary. Therefore, the entire region exposure processing can be performed on the substrate W with a simpler configuration and at low cost. As a result, the substrate processing apparatus 500 is further prevented from being complicated, an increase in size of the substrate processing apparatus 500 is further suppressed and an increase in the manufacturing cost of the substrate processing apparatus 500 is further suppressed.

Note that the light-emitting device 170 may be provided in the alignment device 300. In this case, the entire region exposure unit 100 is constituted by the alignment device 300, the indexer robot IR and the hand IRH.

[6] Sixth Embodiment

The exposure device and the substrate processing apparatus according to the sixth embodiment will be described. In the following description of the substrate processing apparatus, a plurality of processing (the entire region exposure processing, the intermediate liquid coating processing, the development processing and the DSA liquid coating processing) are performed on the substrate W using a similar method as the first embodiment.

(1) Configuration of the Substrate Processing System

Figure 13:
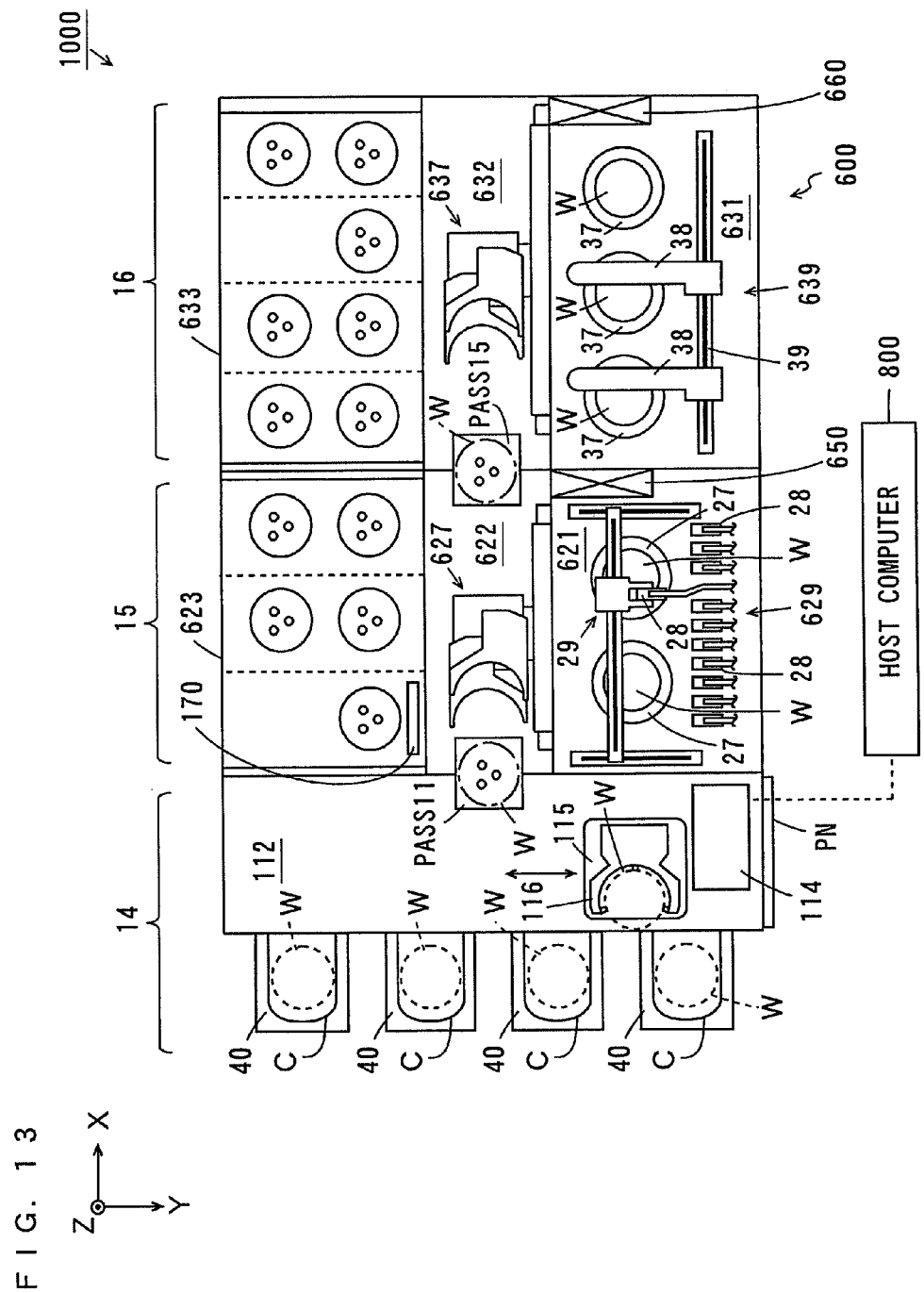
FIG. 13 is a schematic plan view of a substrate processing system according to the sixth embodiment.

FIG. 13 is a schematic plan view of a substrate processing system according to the sixth embodiment. Similarly to FIG. 1, FIG. 13 and FIGS. 14 to 17 described below are accompanied by the arrows that indicate X, Y, and Z directions orthogonal to one another for the clarity of a positional relationship.

As shown in FIG. 13, the substrate processing system 1000 includes a substrate processing apparatus 600 and a host computer 800.

The substrate processing apparatus 600 includes an indexer block 14, a first processing block 15 and a second processing block 16. As shown in FIG. 13, the indexer block 14 includes the plurality of carrier platforms 40 and a transfer section 112. Each carrier C that stores the plurality of substrates W in multiple stages is placed on each carrier platform 40.

A controller 114 and a transfer mechanism 115 are provided in the transfer section 112. The controller 114 controls various constituent elements of the substrate processing apparatus 600. Further, the controller 114 is connected to the host computer 800 by wire communication or wireless communication. Various types of data are transmitted/received between the controller 114 and the host computer 800.

Figure 17:
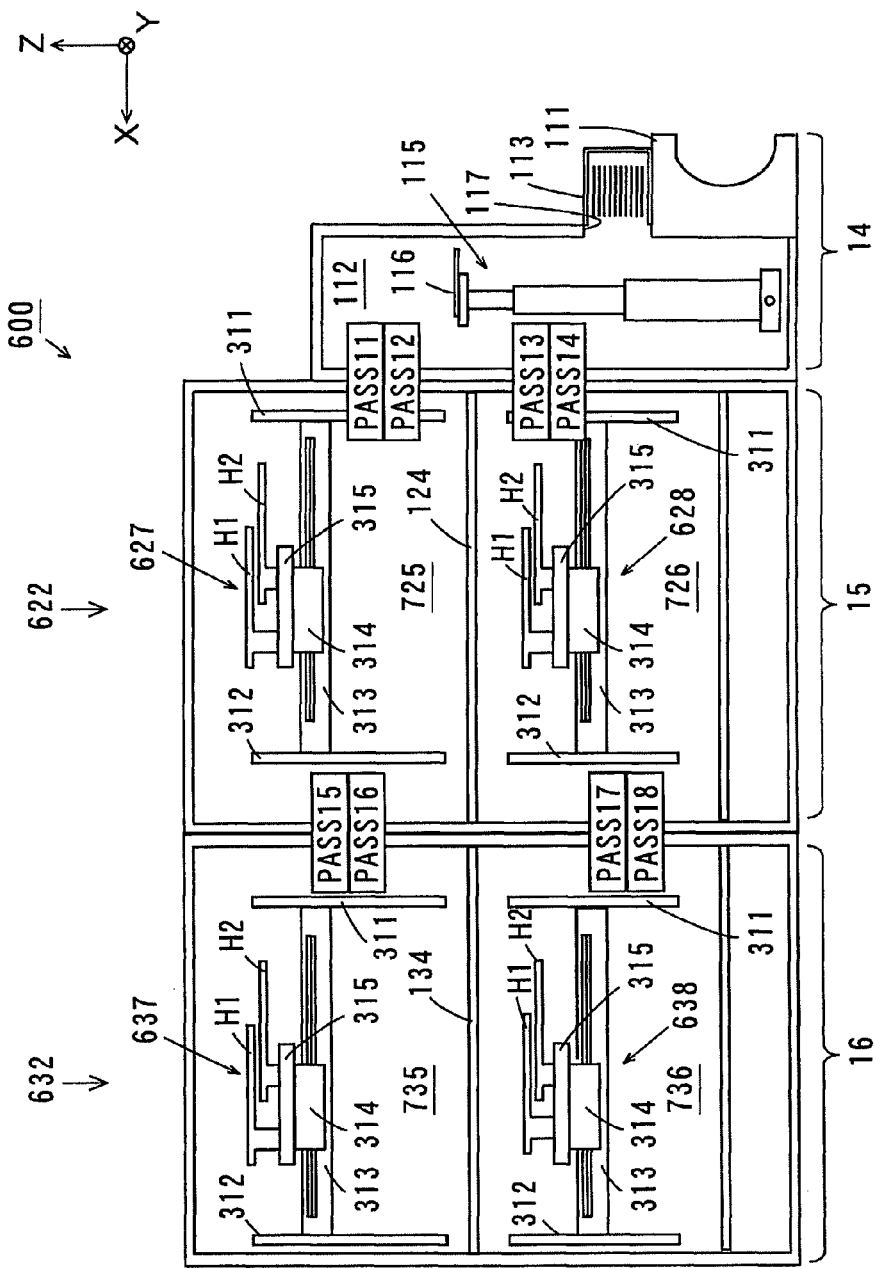
FIG. 17 is a side view showing the transfer section of FIG. 13.

The transfer mechanism 115 has a hand 116 for holding the substrate W. The transfer mechanism 115 transfers the substrate W while holding the substrate W with the hand 116. An opening 117 through which the substrate W is received and transferred between the carrier C and the transfer mechanism 115 is formed in the transfer section 112 as shown in FIG. 17 described below.

A main panel PN is provided on a side surface of the transfer section 112. The main panel PN is connected to the controller 114. A user can confirm the processing status of the substrate W in the substrate processing apparatus 600 and other information on the main panel PN. An operation unit (not shown) is provided in the vicinity of the main panel PN. The user can set operation settings of the substrate processing apparatus 600 and so on by operating the operation unit.

The first processing block 15 includes a coating processing section 621, a transfer section 622 and a thermal processing section 623. The coating processing section 621 and the thermal processing section 623 are provided to be opposite to each other with the transfer section 622 sandwiched therebetween. A substrate platform PASS11 and substrate platforms PASS12 to PASS14 (see FIG. 17), described below, on which the substrates W are to be placed, are provided between the transfer section 622 and the indexer block 14. A transfer mechanism 627 and a transfer mechanism 628 (see FIG. 17) described below that transfer the substrates W are provided in the transfer section 622.

The second processing block 16 includes a coating/development processing section 631, a transfer section 632 and a thermal processing section 633. The coating/development processing section 631 and the thermal processing section 633 are provided to be opposite to each other with the transfer section 632 sandwiched therebetween. A substrate platform PASS15 and substrate platforms PASS16 to PASS18 (see FIG. 17), described below, on which the substrates W are to be placed are provided between the transfer section 632 and the transfer section 622. A transfer mechanism 637 and a transfer mechanism 638 (see FIG. 17) described below, that transfer the substrates W are provided in the transfer section 632.

Figure 14:
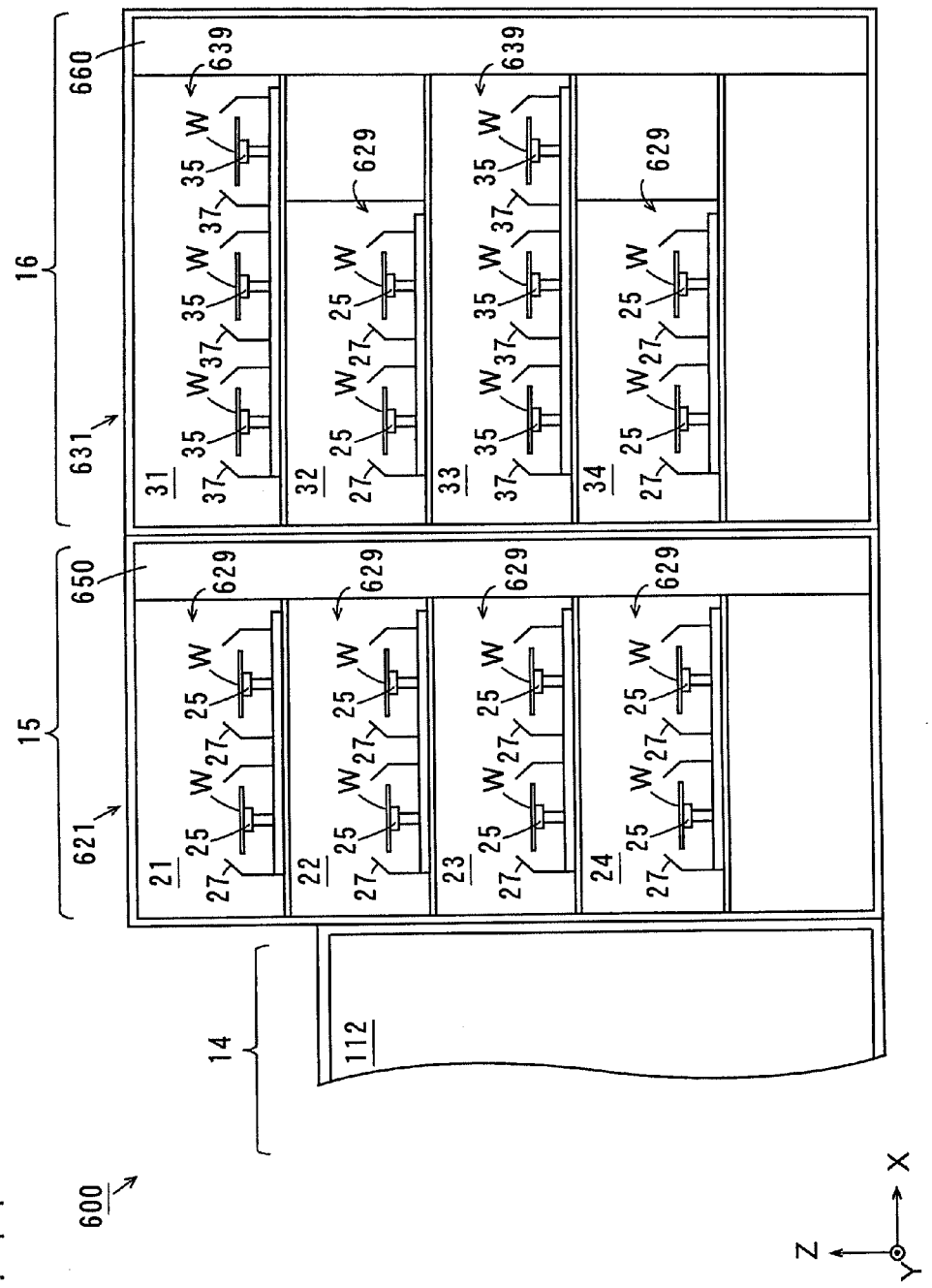
FIG. 14 is a side view of one side of the substrate processing system mainly showing a coating processing section and a coating development processing section of FIG. 13.

(2) Configurations of the Coating Processing Section and the Development Processing Section FIG. 14 is a side view of the one side of the substrate processing system 1000 mainly showing the coating processing section 621 and the coating/development processing section 631 of FIG. 13.

As shown in FIG. 14, coating processing chambers 21, 22, 23, 24 are hierarchically provided in the coating processing section 621. A coating unit 629 is provided in each coating processing chamber 21 to 24. Development processing chambers 31, 33 and coating/processing chambers 32, 34 are hierarchically provided in the coating/development processing section 631. A development liquid supply unit 639 is provided in each development processing chamber 31, 33, and the coating unit 629 is provided in each coating processing chamber 32, 34.

Each coating unit 629 includes spin chucks 25 that hold the substrate W and cups 27 provided to cover the peripheries of the spin chucks 25. In the present embodiment, each coating unit 629 is provided with the two spin chucks 25 and the two cups 27. The spin chucks 25 are rotated by a driving device (an electric motor, for example) that is not shown.

Each coating unit 629 includes a plurality of nozzles 28 that discharge a processing liquid and a nozzle transfer mechanism 29 that transfers the nozzles 28 as shown in FIG. 13.

In the coating unit 629, any one of the plurality of nozzles 28 is moved above the substrate W by the nozzle transfer mechanism 29. The processing liquid is then discharged from the nozzle 28 to be applied onto the substrate W. The spin chuck 25 that holds the substrate W is rotated by the driving device, not shown, when the processing liquid is supplied from the nozzle 28 onto the substrate W, thus causing the substrate W to be rotated.

A coating liquid for an intermediate film is supplied from the nozzles 28 onto the substrates W in the coating units 629 of the coating processing chambers 21 to 24. A coating liquid for a DSA film is supplied from the nozzles 28 onto the substrates W in the coating units 629 of the coating processing chambers 32, 34.

Similarly to the coating unit 629, each development liquid supply unit 639 includes spin chucks 35 and cups 37 as shown in FIG. 14. Each development liquid supply unit 639 includes two slit nozzles 38 that discharge a development liquid and a moving mechanism 39 that moves the slit nozzles 38 in the X direction as shown in FIG. 13.

In the development liquid supply unit 639, each slit nozzle 38 supplies the development liquid onto each substrate W while moving in the X direction. The spin chuck 35 that holds the substrate W is rotated by the driving device, not shown, when the development liquid is supplied from the slit nozzle 38 onto the substrate W, thus causing the substrate W to be rotated.

While the coating unit 629 has the two spin chucks 25 and the two cups 27 and the development liquid supply unit 639 has the three spin chucks 35 and the three cups 37 in the example of FIG. 14, the invention is not limited to this. The number of the spin chucks 25, and the cups 27, 37 may be arbitrarily changed.

As shown in FIGS. 13 and 14, a fluid box 650 is provided in the coating processing section 621. Similarly, a fluid box 660 is provided in the coating/development processing section 631. The fluid box 650 and the fluid box 660 each house fluid related elements such as a pipe, a joint, a valve, a flowmeter, a regulator, a pump, a temperature adjuster used to supply a processing liquid to the coating units 629 and the development liquid supply units 639 and discharge the liquid and air out of the coating units 629 and the development liquid supply units 639.

(3) Configurations of the Thermal Processing Sections

Figure 15:
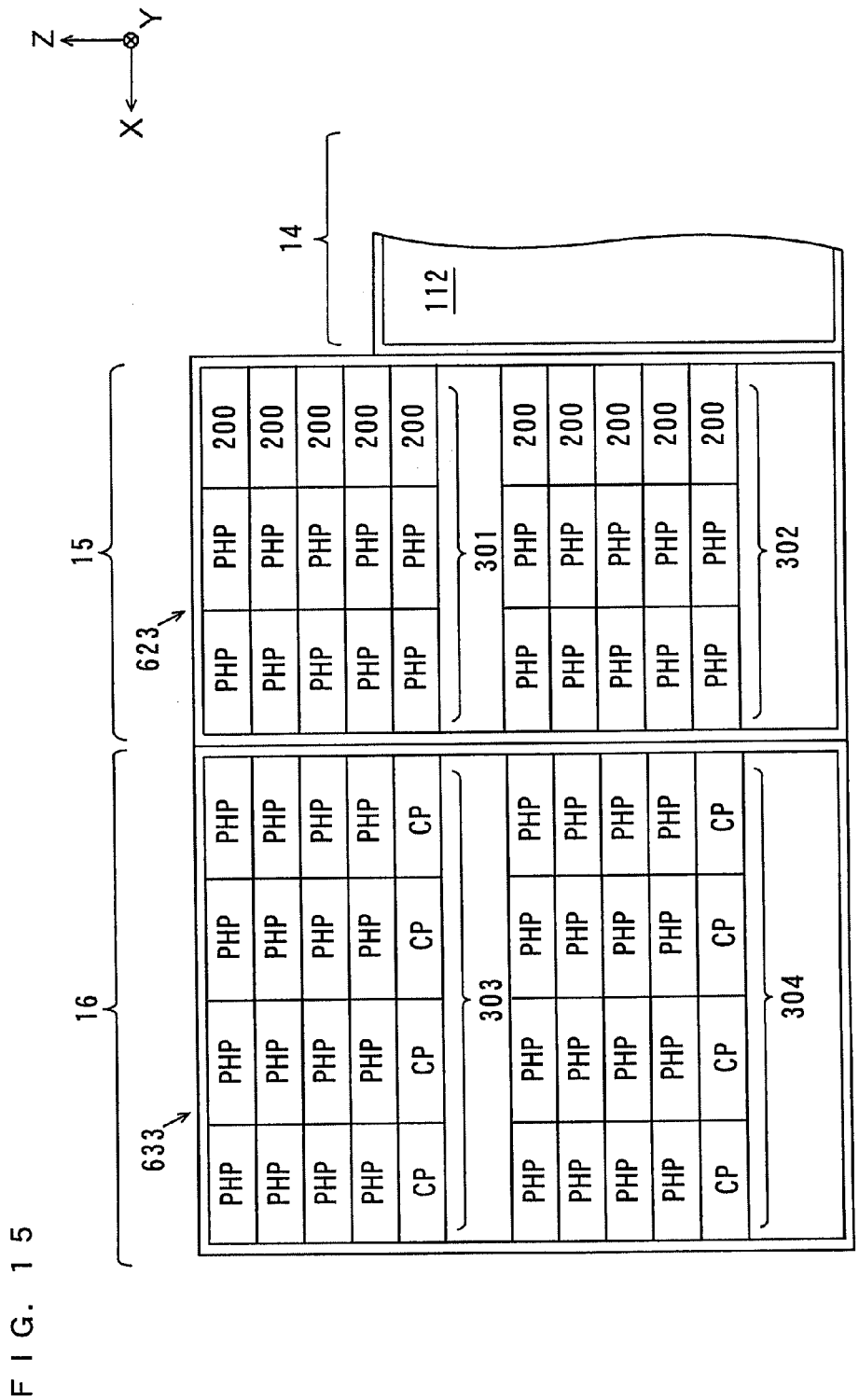
FIG. 15 is a side view of the other side of the substrate processing system mainly showing a thermal processing section of FIG. 13.

FIG. 15 is a side view of the other side of the substrate processing system 1000 mainly showing the thermal processing sections 623, 633 of FIG. 13.

As shown in FIG. 15, the thermal processing section 623 has an upper thermal processing section 301 provided above and a lower thermal processing section 302 provided below. The upper thermal processing section 301 and the lower thermal processing section 302 are each provided with a plurality of temperature adjustment units 200 and a plurality of thermal processing units PHP. The substrates W are subjected to thermal processing and cooling processing in each thermal processing unit PHP.

Figure 9:
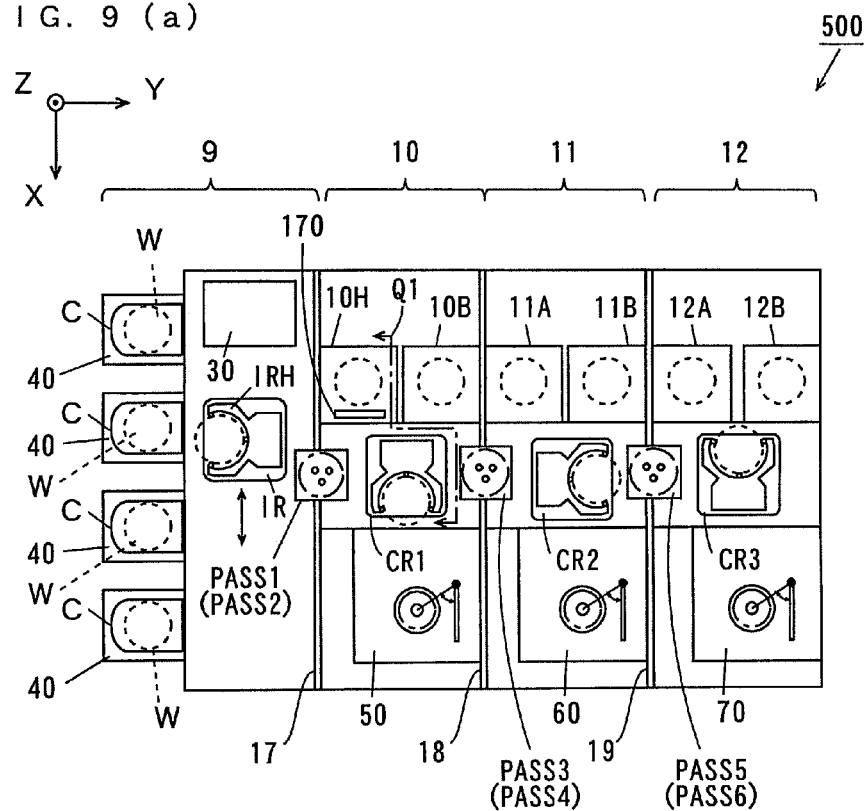
FIG. 9(a) is a plan view showing the substrate processing apparatus according to the second embodiment.
FIG. 9(b) is a side view taken along the line Q1 of FIG. 9(a)
Figure 9:
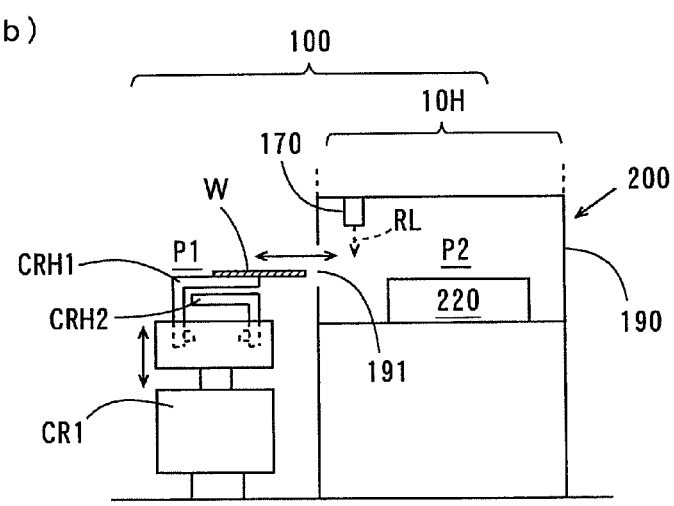
Figure 10:
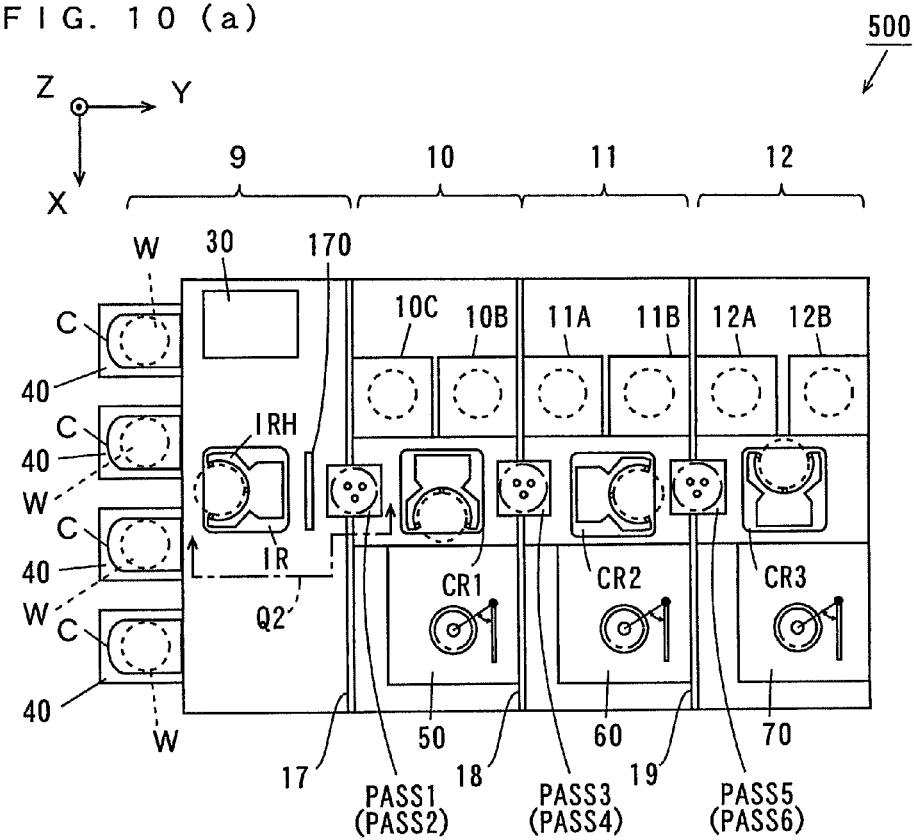
FIG. 10(a) is a plan view showing the substrate processing apparatus according to the third embodiment.
FIG. 10(b) is a side view taken along the line Q2 of FIG. 10(a)
Figure 10:
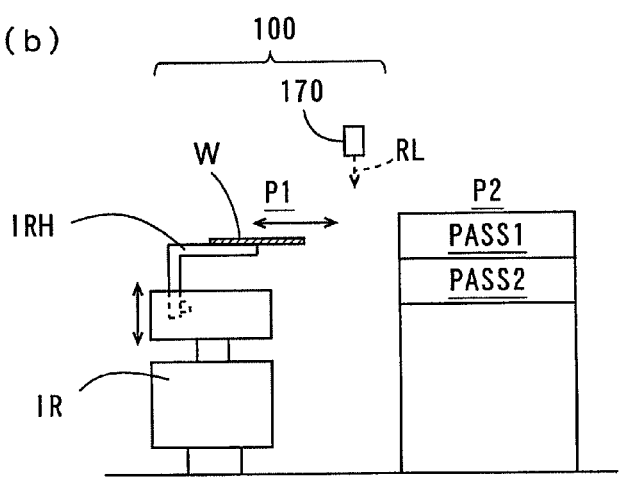
Figure 11:
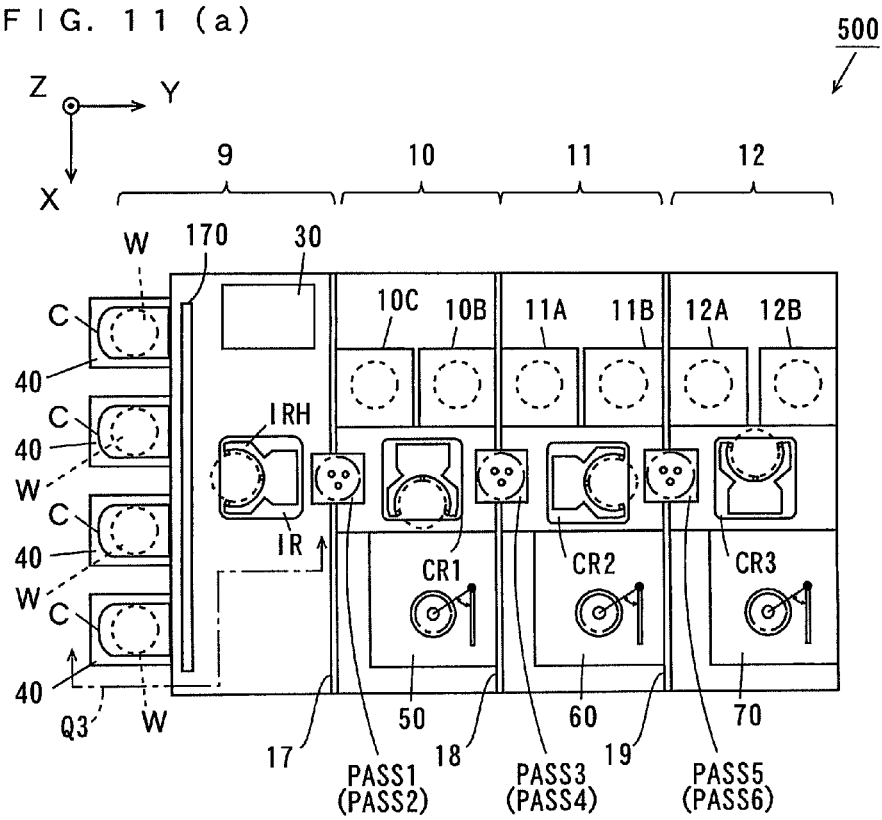
FIG. 11(a) is a plan view showing the substrate processing apparatus according to the fourth embodiment.
FIG. 11(b) is a side view taken along the line Q3 of FIG. 11(a)
Figure 11:
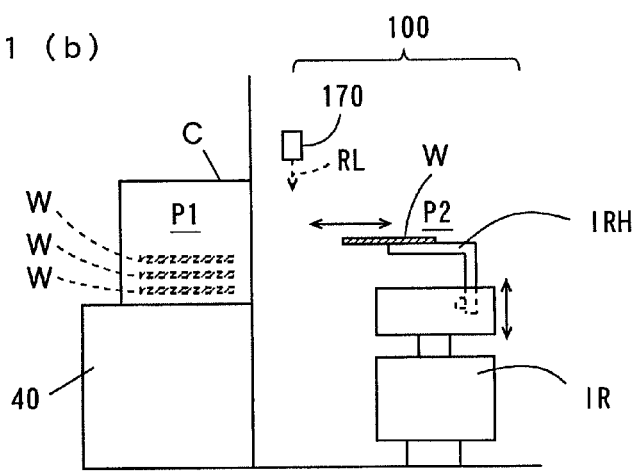
Figure 12:
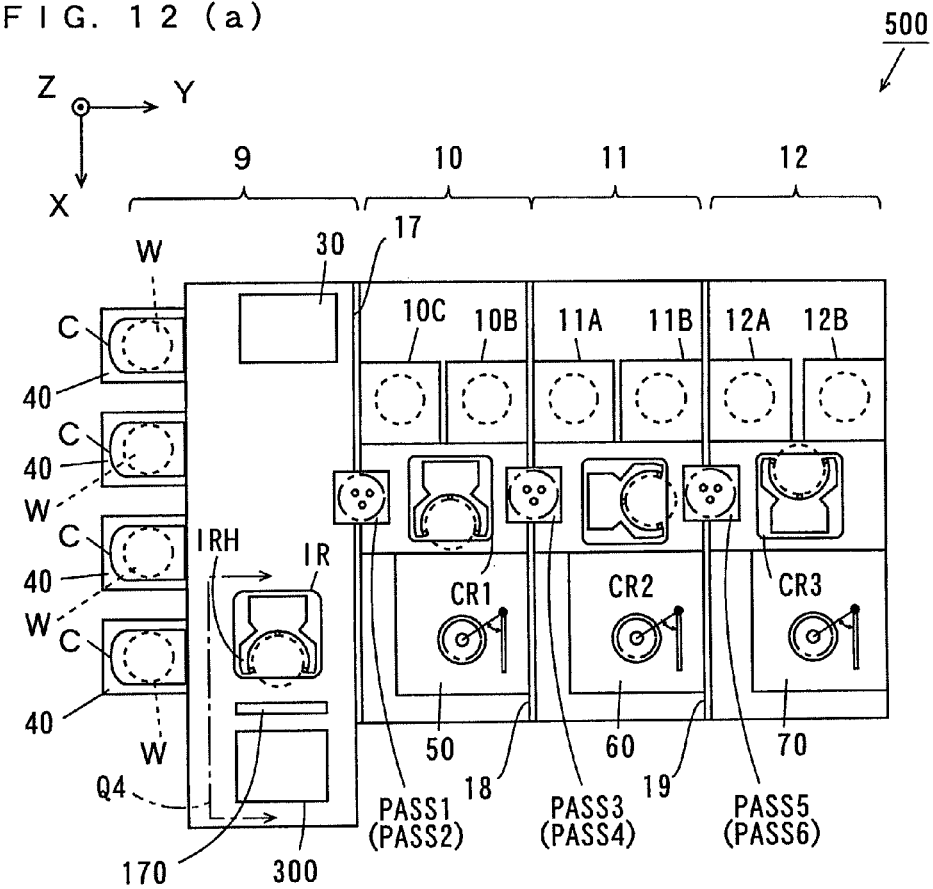
FIG. 12(a) is a plan view showing the substrate processing apparatus according to the fifth embodiment.
FIG. 12(b) is a side view taken along the line Q4 of FIG. 12(a)
Figure 12:
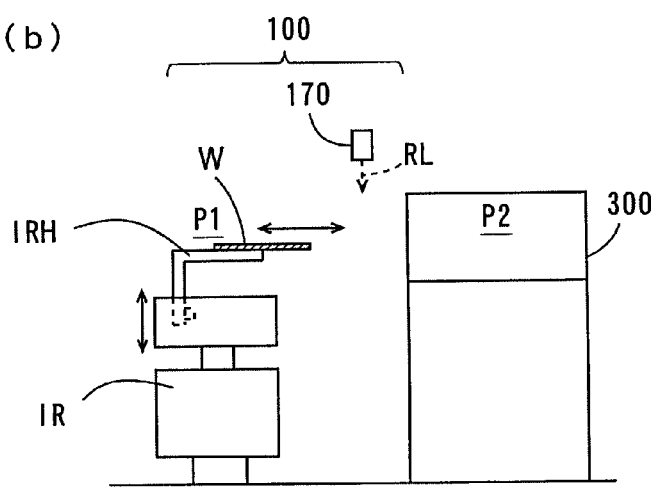

Each temperature adjustment unit 200 has the same configuration as the temperature adjustment unit 200 of FIG. 9 according to the second embodiment. This causes a temperature of the substrate W to be adjusted on the platform 220 (FIG. 9). Further, in each temperature adjustment unit 200, the substrate W held by hands H1, H2 (see FIG. 16) described below is carried in/out by the transfer mechanism 627, or the transfer mechanism 628 (see FIG. 16) described below. The entire region exposure processing is performed by the light-emitting device 170 (FIG. 9) when the substrate W is carried to/from the temperature adjustment unit 200.

Figure 16:
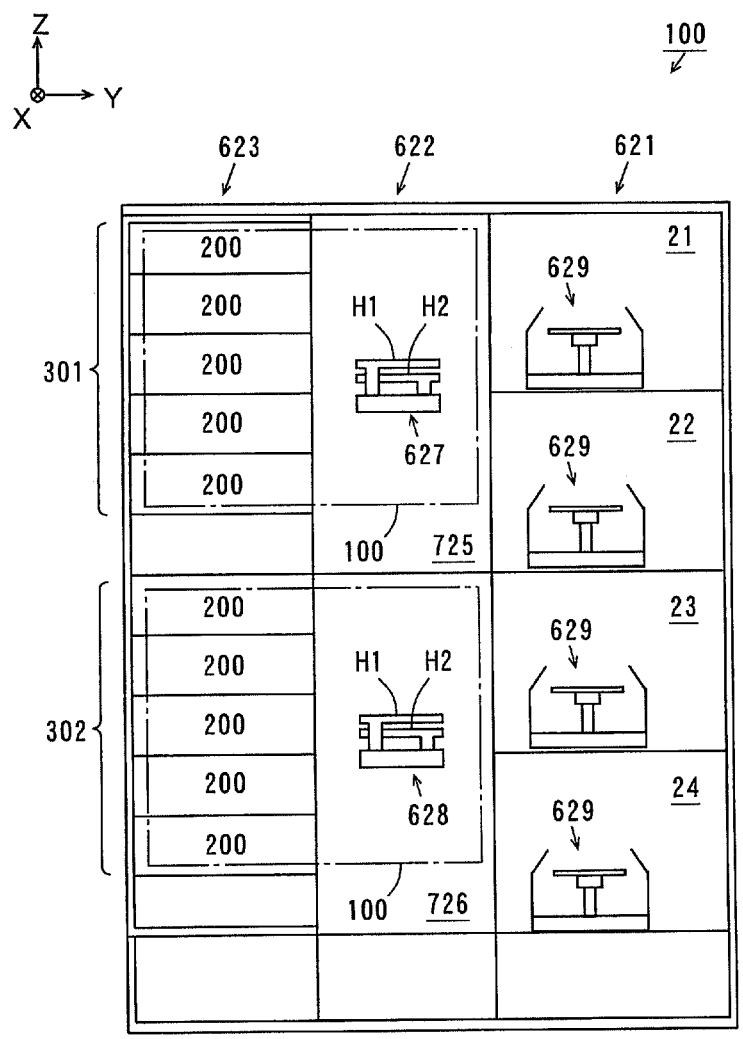
FIG. 16 is a side view mainly showing the coating processing section, a transfer section and a thermal processing section of FIG. 13.

In the present embodiment, the entire region exposure unit 100 is constituted by the temperature adjustment units 200, the transfer mechanism 627 and the hands H1, H2 (see FIG. 16). Further, the entire region exposure unit 100 is constituted by the temperature adjustment units 200, the transfer mechanism 628 and the hands H1, H2 (see FIG. 16). Further, in the present embodiment, the first position is set outside of each temperature adjustment unit 200 (inside an upper transfer chamber 725 and inside a lower transfer chamber 726 of FIG. 16 described below), and the second position is set inside of each temperature adjustment unit 200.

The thermal processing section 633 has an upper thermal processing section 303 provided above and a lower thermal processing section 304 provided below. The upper thermal processing section 303 and the lower thermal processing section 304 are each provided with the plurality of thermal processing units PHP and the plurality of cooling units CP. The cooling processing for the substrate W is performed in each cooling unit CP.

(4) Configuration of the Transfer Sections (4-1) Schematic Configuration

FIG. 16 is a side view mainly showing the coating processing section 621, the transfer section 622 and the thermal processing section 623 of FIG. 13. FIG. 17 is a side view mainly showing the transfer sections 622, 632 of FIG. 13.

As shown in FIGS. 16 and 17, the transfer section 622 has the upper transfer chamber 725 and the lower transfer chamber 726. The transfer section 632 has an upper transfer chamber 735 and a lower transfer chamber 736.

The upper transfer chamber 725 is provided with the transfer mechanism 627 and the lower transfer chamber 726 is provided with the transfer mechanism 628. Further, the upper transfer chamber 735 is provided with the transfer mechanism 637, and the lower transfer chamber 736 is provided with the transfer mechanism 638.

As shown in FIG. 16, the coating chambers 21, 22 and the upper thermal processing section 301 are provided to be opposite to each other with the upper transfer chamber 725 sandwiched therebetween, and the coating processing chambers 23, 24 and the lower thermal processing chamber 302 are provided to be opposite to each other with the lower transfer chamber 726 sandwiched therebetween. Similarly, the development processing chamber 31 and the coating processing chamber 32 (FIG. 14), and the upper thermal processing section 303 (FIG. 15) are provided to be opposite to each other with the upper transfer chamber 735 (FIG. 17) sandwiched therebetween, and the development processing chamber 33 and the coating processing chamber 34 (FIG. 14), and the lower thermal processing section 304 (FIG. 15) are provided to be opposite to each other with the lower transfer chamber 736 (FIG. 17) sandwiched therebetween.

As shown in FIG. 17, the substrate platforms PASS11, PASS12 are provided between the transfer section 112 and the upper transfer chamber 725, and the substrate platforms PASS13, PASS14 are provided between the transfer section 112 and the lower transfer chamber 726. The substrate platforms PASS15, PASS16 are provided between the upper transfer chamber 725 and the upper transfer chamber 735, and the substrate platforms PASS17, PASS18 are provided between the lower transfer chamber 726 and the lower transfer chamber 736.

The substrates W to be transferred from the indexer block 14 to the first processing block 15 are placed on the substrate platform PASS11 and the substrate platform PASS13. The substrates W to be transferred from the first processing block 15 to the indexer block 14 are placed on the substrate platform PASS12 and the substrate platform PASS14.

The substrates W to be transferred from the first processing block 15 to the second processing block 16 are placed on the substrate platform PASS15 and the substrate platform PASS17, and the substrates W to be transferred from the second processing block 16 to the first processing block 15 are placed on the substrate platform PASS16 and the substrate platform PASS18.

(4-2) Configuration of the Transfer Mechanism

Figure 18:
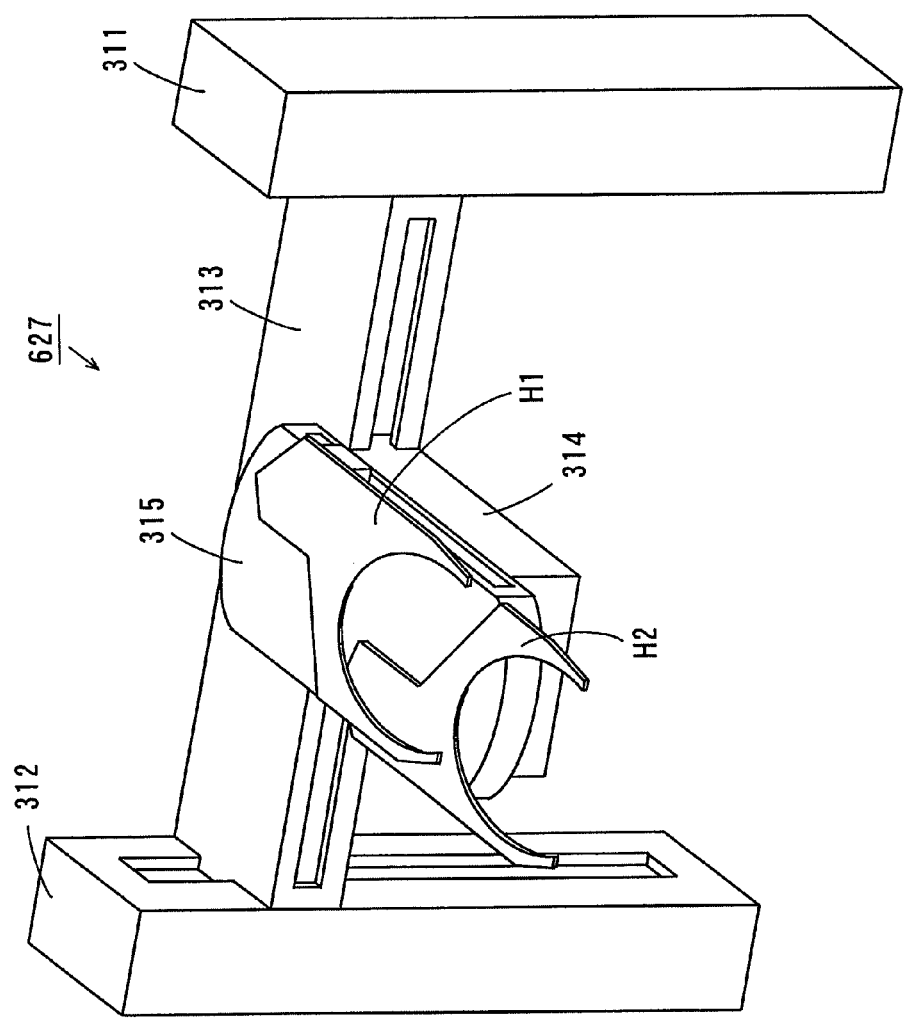
FIG. 18 is a perspective view showing a transfer mechanism.

Next, description will be made of the transfer mechanism 627. FIG. 18 is a perspective view showing the transfer mechanism 627.

As shown in FIGS. 17 and 18, the transfer mechanism 627 has long-sized guide rails 311, 312. As shown in FIG. 17, the guide rail 311 is fixed on the transfer section 112 side to extend in the vertical direction in the upper transfer chamber 725. The guide rail 312 is fixed on the upper transfer chamber 735 side to extend in the vertical direction in the upper transfer chamber 725.

As shown in FIGS. 17 and 18, a long-sized guide rail 313 is provided between the guide rail 311 and the guide rail 312. The guide rail 313 is attached to the guide rails 311, 312 in a vertically movable manner. A moving member 314 is attached to the guide rail 313. The moving member 314 is provided in a movable manner in a longitudinal direction of the guide rail 313.

A long-sized rotating member 315 is provided on an upper surface of the moving member 314 in a rotatable manner. A hand H1 and a hand H2 for holding the substrate W are attached to the rotating member 315. The hands H1, H2 are provided in a movable manner in a longitudinal direction of the rotating member 315.

The above-described configuration allows the hands H1, H2 provided at the transfer mechanism 627 to freely move in the X direction and the Z direction in the upper transfer chamber 725. The substrate W can be transferred among the coating processing chambers 21, 22 (FIG. 14), the substrate platforms PASS11, PASS12, PASS15, PASS16 (FIG. 17) and the upper thermal processing section 301 (FIG. 15) using the hands H1, H2.

Each transfer mechanisms 628, 637, 638 has the same configuration as the transfer mechanism 627 as shown in FIG. 17.

(5) Operation of Each Constituent Element of the Substrate Processing Apparatus

Description will be made of the operation of each constituent element of the substrate processing apparatus 600 according to the present embodiment.

(5-1) Operation of the Indexer Block 14

Description will be made of the operation of the indexer block 14 mainly using FIGS. 13 and 17.

First, in the substrate processing apparatus 600 according to the present embodiment, the carrier C that stores the substrates W in the initial state (see FIG. 4(a)) is placed on the carrier platform 40 of the indexer block 14. The transfer mechanism 115 takes one substrate W out of the carrier C and transfers the substrate W to the substrate platform PASS11. Thereafter, the transfer mechanism 115 takes another substrate W in the initial state out of the carrier C and transfers the substrate W to the substrate platform PASS13 (FIG. 17).

When the processed substrate W (see FIG. 4(f)) is placed on the substrate platform PASS12 (FIG. 17), the transfer mechanism 115 transfers the substrate W in the initial state to the substrate platform PASS11 and subsequently takes the processed substrate W out of the substrate platform PASS12. Then, the transfer mechanism 115 transfers the processed substrate W to the carrier C. Similarly, when the processed substrate W is placed on the substrate platform PASS14, the transfer mechanism 115 transfers the substrate W in the initial state to the substrate platform PASS13, and subsequently takes the processed substrate W out of the substrate platform PASS14. Then, the processed substrate W is transferred to the carrier C by the transfer mechanism 115 to be stored in the carrier C.

(5-2) Operation of the First Processing Block 15

Description will be made of the operation of the first processing block 15 mainly using FIGS. 13 to 15 and 17. Movement of the transfer mechanisms 627, 628 in the X direction and the Z direction is not explained in the following paragraphs for simplification.

The substrate W placed on the substrate platform PASS11 (FIG. 17) by the transfer mechanism 115 (FIG. 17) is taken out by the hand H1 provided in the transfer mechanism 627 (FIG. 17). The transfer mechanism 627 places the substrate W held by the hand H2 on the substrate platform PASS12. The substrate W placed on the substrate platform PASS12 by the hand H2 is the substrate W after the DSA liquid coating processing.

Next, the transfer mechanism 627 takes the substrate W out of a predetermined temperature adjustment unit 200 of the upper thermal processing section 301 (FIG. 3) using the hand H2. The main surface of the substrate W is irradiated with the light RL (see FIG. 9(b)) when the substrate W is taken out. Further, the transfer mechanism 627 carries the substrate W in the initial state held by the hand H1 into the temperature adjustment unit 200. The main surface of the substrate W is irradiated with the light RL (see FIG. 9(b)) at the time of carrying the substrate W in/out. In such a manner, the entire region exposure processing is performed on the substrate W. As described above, the platform 220 of the temperature adjustment unit 200 (FIG. 9) has a mechanism for adjusting a temperature of the substrate W. Thus, in the temperature adjustment unit 200 of this example, a temperature of the substrate W is adjusted to a suitable temperature for the intermediate liquid coating processing.

Next, the transfer mechanism 627 takes the substrate W after formation of the intermediate film (see FIG. 4(c)) out of the spin chuck 25 (FIG. 14) of the coating processing chamber 22 (FIG. 14) using the hand H1. Further, the transfer mechanism 627 places the substrate W after the entire region exposure processing held by the hand H2 on the spin chuck 25. The intermediate film is formed on the substrate W by the coating unit 629 (FIG. 14) in the coating processing chamber 22.

Next, the transfer mechanism 627 takes the substrate W after the thermal processing out of a predetermined thermal processing unit PHP of the upper thermal processing section 301 (FIG. 15) using the hand H2. The transfer mechanism 627 carries the substrate W after formation of the intermediate film held by the hand H1 in the thermal processing unit PHP. The substrate W is successively subjected to the heating processing and the cooling processing in the thermal processing unit PHP.

The transfer mechanism 627 then places the substrate W after the thermal processing held by the hand H2 on the substrate platform PASS15 (FIG. 17). The transfer mechanism 627 takes the substrate W after the DSA liquid coating processing out of the substrate platform PASS16 (FIG. 17) using the hand H2. Thereafter, the transfer mechanism 627 subsequently transfers the substrate W after the DSA liquid coating processing that has been taken out of the substrate platform PASS16 to the substrate platform PASS12 (FIG. 17).

The transfer mechanism 627 repeats the processing described above such that the plurality of substrates W are successively subjected to the predetermined processing in the first processing block 15.

The transfer mechanism 628 performs the same operation as the transfer mechanism 627 to carry in/out the substrates W to/from the substrate platforms PASS13, PASS14, PASS17, PASS18 (FIG. 17), the coating processing chambers 23, 24 (FIG. 14) and the lower thermal processing section 302 (FIG. 15).

As described above, in the present embodiment, the substrate W transferred by the transfer mechanism 627 is processed in the coating processing chambers 21, 22 and the upper thermal processing section 301, and the substrate W transferred by the transfer mechanism 628 is processed in the coating processing chambers 23, 24 and the lower thermal processing section 302. In this case, the plurality of substrates W can be simultaneously processed in the upper processing sections (the coating processing chambers 21, 22 and the upper thermal processing section 301) and the lower processing sections (the coating processing chambers 23, 24 and the lower thermal processing section 302). This improves throughput of the first processing block 15 without increasing the transfer speed of the substrate W by the transfer mechanisms 627, 628. The transfer mechanisms 627, 628 are provided one above the other, thus preventing an increase in footprints of the substrate processing apparatus 600.

(5-3) Operation of the Second Processing Block 16

Description will be made of the operation of the second processing block 16 mainly using FIGS. 13 to 15 and 17. Movement of the transfer mechanisms 637, 638 in the X direction and the Z direction is not explained in the following paragraphs for simplification.

The substrate W placed on the substrate platform PASS15 (FIG. 17) by the transfer mechanism 627 is taken out by the hand H1 provided in the transfer mechanism 637 (FIG. 17). The transfer mechanism 637 places the substrate W held by the hand H2 on the substrate platform PASS16. The substrate W placed on the substrate platform PASS16 by the hand H2 is the substrate W after the DSA liquid coating processing.

Next, the transfer mechanism 637 takes the substrate W after the cooling processing out of a predetermined cooling unit CP (FIG. 15) of the upper thermal processing section 303 (FIG. 3) using the hand H2. The transfer mechanism 637 carries the substrate W after formation of the intermediate film held by the hand H1 into the cooling unit CP. In the cooling unit CP, the substrate W is cooled to a temperature suitable for the development processing.

The transfer mechanism 637 then takes the substrate W after the development processing out of the spin chuck 35 (FIG. 14) of the development processing chamber 31 (FIG. 14) using the hand H1. The transfer mechanism 637 places the substrate W after the cooling processing held by the hand H2 on the spin chuck 35. In the development processing chamber 31, the development processing is performed by the development liquid supply unit 639.

Next, the transfer mechanism 637 takes the substrate W after the thermal processing out of a predetermined thermal processing unit PHP of the upper thermal processing section 303 (FIG. 15) using the hand H2. The transfer mechanism 637 carries the substrate W after the development processing held by the hand H1 into the thermal processing unit PHP.

Next, the transfer mechanism 637 takes the substrate W after the cooling processing out of a predetermined cooling unit CP (FIG. 15) of the upper thermal processing section 303 (FIG. 15) using the hand H1. The transfer mechanism 637 carries the substrate W after the development processing and the thermal processing held by the hand H2 into the cooling unit CP. In the cooling unit CP, the substrate W is cooled to a temperature suitable for the DSA liquid coating processing.

The transfer mechanism 637 then takes the substrate W after the DSA liquid coating processing out of the spin chuck 25 (FIG. 14) in the coating processing chamber 32 (FIG. 14) using the hand H2. The transfer mechanism 637 places the substrate W after the cooling processing held by the hand H1 on the spin chuck 25. In the coating processing chamber 32, the coating unit 629 (FIG. 14) performs the DSA liquid coating processing on the substrate W.

The transfer mechanism 637 then takes the substrate W after the thermal processing out of a predetermined thermal processing unit PHP in the upper thermal processing section 303 (FIG. 15) using the hand H1. The transfer mechanism 637 carries the substrate W after the DSA liquid coating processing held by the hand H2 into the thermal processing unit PHP.

The transfer mechanism 637 then takes the substrate W after the cooling processing out of a predetermined cooling unit (FIG. 15) in the upper thermal processing section 303 (FIG. 15) using the hand H2. The transfer mechanism 637 carries the substrate W after the DSA liquid coating processing and thermal processing held by the hand H1 into the cooling unit CP. In the cooling unit CP, the substrate W is cooled. Thereafter, the transfer mechanism 637 places the substrate W taken out of the cooling unit CP on the substrate platform PASS16 (FIG. 17).

The transfer mechanism 637 repeats the processing described above such that the plurality of substrates W are successively subjected to the predetermined processing in the second processing block 16.

The transfer mechanism 638 performs the same operation as the transfer mechanism 637 to carry in/out the substrate W to/from the substrate platforms PASS17, PASS18, the development processing chamber 33 (FIG. 14), the coating processing chamber 34 (FIG. 14) and the lower thermal processing section 304 (FIG. 15).

Thus, in the present embodiment, the substrate W transferred by the transfer mechanism 637 is processed in the development processing chamber 31, the coating processing chamber 32 and the upper thermal processing section 303, and the substrate W transferred by the transfer mechanism 638 is processed in the development processing chamber 33, the coating processing chamber 34 and the lower thermal processing section 304. In this case, the plurality of substrates W can be simultaneously processed in the upper processing sections (the development processing chamber 31, the coating processing chamber 32 and the upper thermal processing section 303) and the lower processing sections (the development processing chamber 33, the coating processing chamber 34 and the lower thermal processing section 304). This improves throughput of the second processing block 16 without increasing the transfer speed of the substrate W by the transfer mechanisms 637 and 638. The transfer mechanisms 637 and 638 are provided one above the other, thus preventing an increase in footprints of the substrate processing apparatus 600.

[7] Seventh Embodiment

As for the substrate processing apparatus according to the seventh embodiment, the difference from the substrate processing apparatus according to the sixth embodiment will be described. In the substrate processing apparatus according to the seventh embodiment, an exposure temperature adjustment unit described below is provided as the exposure device in this invention instead of each temperature adjustment unit 200 in the thermal processing section 623 of FIG. 15 according to the sixth embodiment.

(1) Configuration of the Exposure Temperature Adjustment Unit

Figure 19:
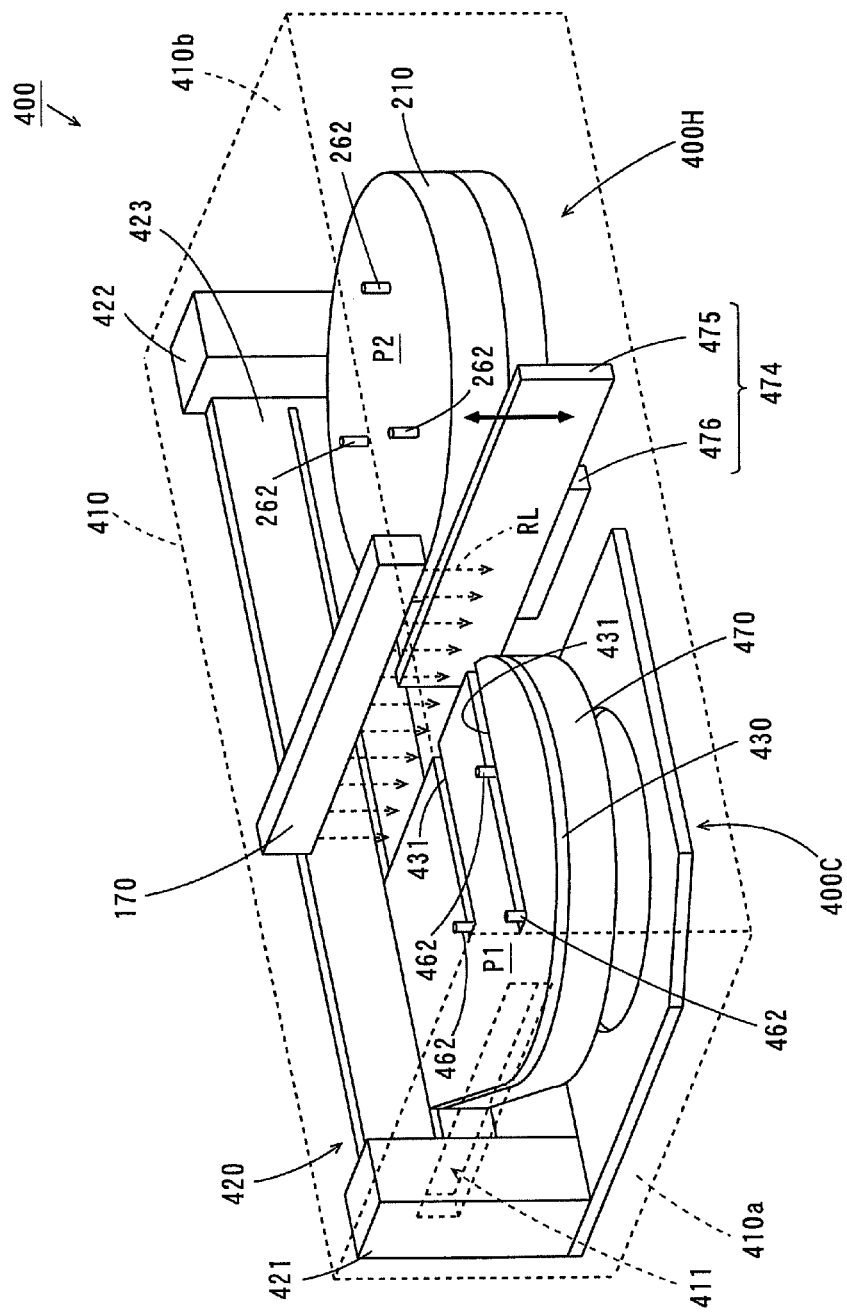
FIG. 19 is a perspective view of an exposure temperature adjustment unit according to the seventh embodiment.
Figure 20:
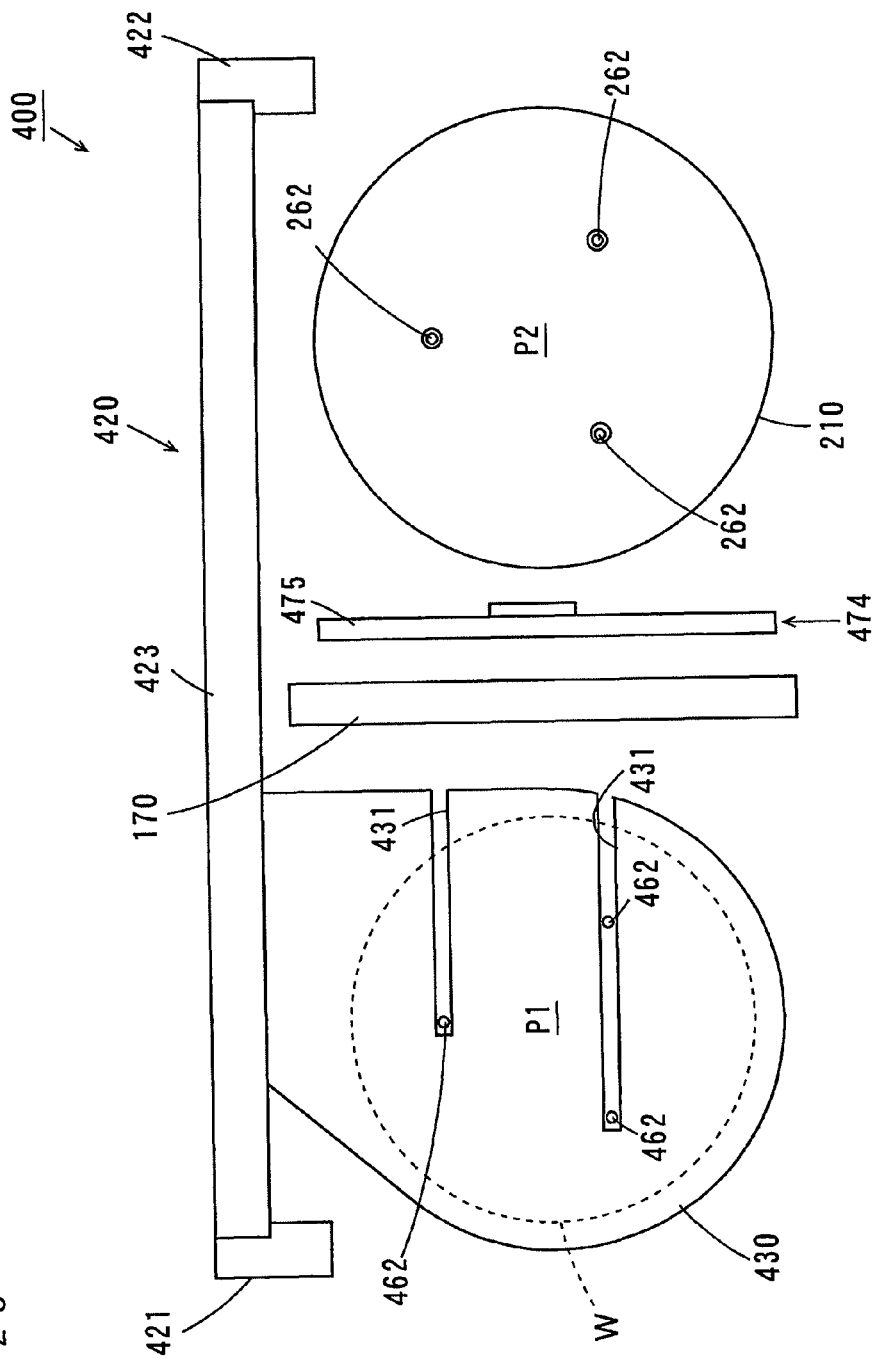
FIG. 20 is a plan view of the exposure temperature adjustment unit of FIG. 19.

FIG. 19 is a perspective view of the exposure temperature adjustment unit according to the seventh embodiment. FIG. 20 is a plan view of the exposure temperature adjustment unit 400 of FIG. 19, and FIG. 21 is a side view of the exposure temperature adjustment unit 400 of FIG. 19.

Figure 21:
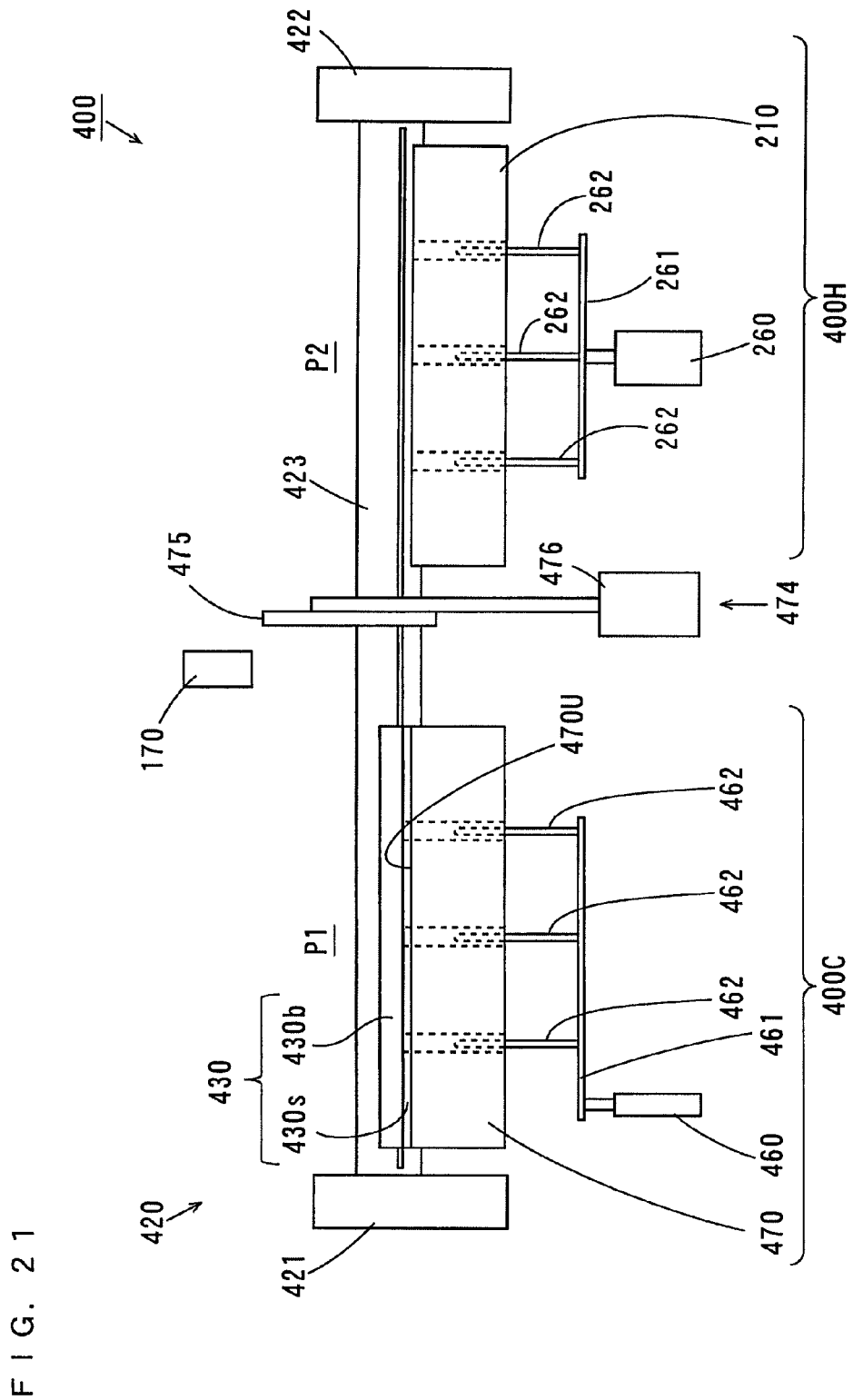
FIG. 21 is a side view of the exposure temperature adjustment unit of FIG. 19.

As shown in FIGS. 19 to 21, the exposure temperature adjustment unit 400 includes the light-emitting device 170, a cooler 400C, a heater 400H, a casing 410, a transfer mechanism 420 and a shutter device 474. The light-emitting device 170, the cooler 400C, the heater 400H, the transfer mechanism 420 and the shutter device 474 are stored in the casing 410, respectively. The casing 410 is not shown in FIGS. 20 and 21.

The casing 410 has a rectangular parallelepiped shape. An opening 411 that communicates with the inner space of the casing 410 and the inner space of the transfer chamber (the upper transfer chamber 725 or the lower transfer chamber 726 of FIG. 17 in this example) is formed in the one sidewall 410a of the casing 410 (FIG. 19). The substrate W is carried to/from the exposure temperature adjustment unit 400 through the opening 411.

Inside of the casing 410, the cooler 400C and the heater 400H are arranged in this order from the one sidewall 410a of the casing 410 (FIG. 19) towards the other sidewall 410b (FIG. 19) that is opposite to the one sidewall 410a. The shutter device 474 is provided between the cooler 400C and the heater 400H. Further, the light-emitting device 170 is provided between the cooler 400C and the shutter device 474, and also at the upper portion of the casing 410.

As shown in FIG. 21, the cooler 400C includes a substrate platform plate 470, a lifting/lowering device 460, a coupling member 461 and a plurality of (three in this example) support pins 462.

The substrate platform plate 470 has a circular upper surface 470U. The upper surface 470U of the substrate platform plate 470 has a larger diameter than that of the substrate W and is configured such that the transfer arm 430 described below can come into contact with the upper surface 470U. A plurality of (three in this example) support pin insert holes are formed through the substrate platform plate 470. A circulation flow path of cooling water (not shown) is formed in the substrate platform plate 470. In this case, cooling water is supplied to the circulation flow path such that a temperature of the substrate platform plate 470 can be adjusted to a predetermined temperature. Thus, the substrate W held by the transfer arm 430 can be cooled together with the transfer arm 430 while the transfer arm 430 described below is in contact with the upper surface 470U of the substrate platform plate 470.

The coupling member 461 is attached to the lifting/lowering device 460 in a vertically movable manner. The coupling member 461 attached to the lifting/lowering device 460 is arranged below the substrate platform plate 470.

The plurality of (three in this example) support pins 462 are attached to the coupling member 461 to extend in the vertical direction. Each support pin 462 is a bar-shaped member having a circular cross section. The plurality of support pins 462 are arranged to be inserted into the plurality of support pin insert holes of the substrate platform plate 470 by moving vertically.

The lifting/lowering device 460 operates such that the coupling member 461 is moved vertically. Thus, the upper ends of the plurality of support pins 462 are moved between positions above the substrate platform plate 470 and positions below the upper surface of the substrate platform plate 470 through the plurality of support pin insert holes of substrate platform plate 470.

The heater 400H includes a substrate platform plate 210, a lifting/lowering device 260, a coupling member 261 and a plurality of (three in this example) support pins 262.

The substrate platform plate 210 has an upper surface on which the substrate W can be placed. The upper surface of the substrate platform plate 210 has a larger diameter than that of the substrate W. The upper surface of the substrate platform plate 210 is provided with a plurality of proximity balls (not shown). The plurality of (three in this example) support pin insert holes are formed through the substrate platform plate 210. A heat generator such as a mica heater is provided in the substrate platform plate 210. The heat generator is connected to a temperature adjustment device (not shown). The temperature adjustment device is controlled by the controller 114 of FIG. 13 such that a temperature of the generator is adjusted. Thus, a temperature of the substrate platform plate 210 is adjusted to a predetermined temperature, and the substrate W placed on the substrate platform plate 210 is heated.

The lifting/lowering device 260, the coupling member 261 and the plurality of support pins 262 have the same configuration as the lifting/lowering device 460, the coupling member 461 and the plurality of support pins 462, respectively.

The transfer mechanism 420 includes two long-sized guide rails 421, 422 that are provided to extend vertically. As shown in FIG. 19, the one guide rail 421 is fixed on the one sidewall 410a side in the casing 410, and the other guide rail 422 is fixed on the other sidewall 410b side in the casing 410. Long-sized guide rail 423 is provided between the guide rails 421 and the guide rail 422. The guide rail 423 is attached to the guide rail 421, 422 to be vertically movable. The transfer arm 430 is attached to the guide rail 423 to be longitudinally movable.

As shown in FIG. 21, the transfer arm 430 includes a flat plate-shaped member 430b and a thermal conduction sheet 430s. The plate-shaped member 430b is mainly made of a metal material such as aluminum and is constituted by a plate-shaped member having a larger outer shape than that of substrate W. The plate-shaped member 430b of the transfer arm 430 has an upper surface on which the substrate W can be placed. The upper surface of the plate-shaped member 430b is provided with a plurality of proximity balls (not shown). The thermal conduction sheet 430s is attached to the lower surface of the plate-shaped member 430b. The thermal conduction sheet 430s is constituted by sheet-like resin material, for example, in which metal is added. The transfer arm 430 is provided with a plurality of slits 431 for not interfering with the plurality of support pins 462 in the cooler 400C and the plurality of support pins 262 in the heater 400H.

The shutter device 474 includes a shutter 475 and a shutter driver 476. In this example, the shutter driver 476 moves the shutter 475 between a position higher than the upper surface 470U of the substrate platform plate 470 and the upper surface of the substrate platform plate 210 (hereinafter referred to a closed position), and a position lower than the upper surface of the substrate platform 470 and the upper surface of the substrate platform plate 210 (hereinafter referred to as an opened position).

When the shutter 475 is at the closed position, the space from the one sidewall 410a of the casing 410 (FIG. 19) to the shutter 475 (a space that surrounds the cooler 400C and the light-emitting device 170) and the space from the shutter 475 to the other sidewall 410b of the casing 410 (FIG. 19) (a space that surrounds the heater 400H) are shielded by the shutter 475.

On the other hand, when the shutter 475 is at the opened position, the space from the one sidewall 410a of the casing 410 to the shutter 475 and the space from the shutter 475 to the other sidewall 410b of the casing 410 communicate with each other.

The light-emitting device 170 of this example has the same configuration as the light-emitting device 170 of FIG. 5. The light-emitting device 170 is arranged such that the strip-shaped light RL is emitted to a space between the cooler 400C and the heater 400H and the strip-shaped light RL crosses the horizontal moving path of the substrate W held by the transfer arm 430.

In the present embodiment, the first position P1 is set on the substrate platform plate 470 in the cooler 400C in a horizontal plane, and the second position P2 is set on the substrate platform plate 210 in the heater 400H in a horizontal plane.

(2) Operation of the Thermal Processing Unit

Description will be made of the operation of the exposure temperature adjustment unit 400 of FIGS. 19 to 21. FIGS. 22 to 31 are schematic side views showing the operation of the exposure temperature adjustment unit 400. In FIGS. 22 to 31, parts of a plurality of constituent elements of the exposure temperature adjustment unit 400 are shown. In this example, the strip-shaped light RL is emitted from the light-emitting device 170 while the substrate processing apparatus 600 is turned on.

Figure 22:
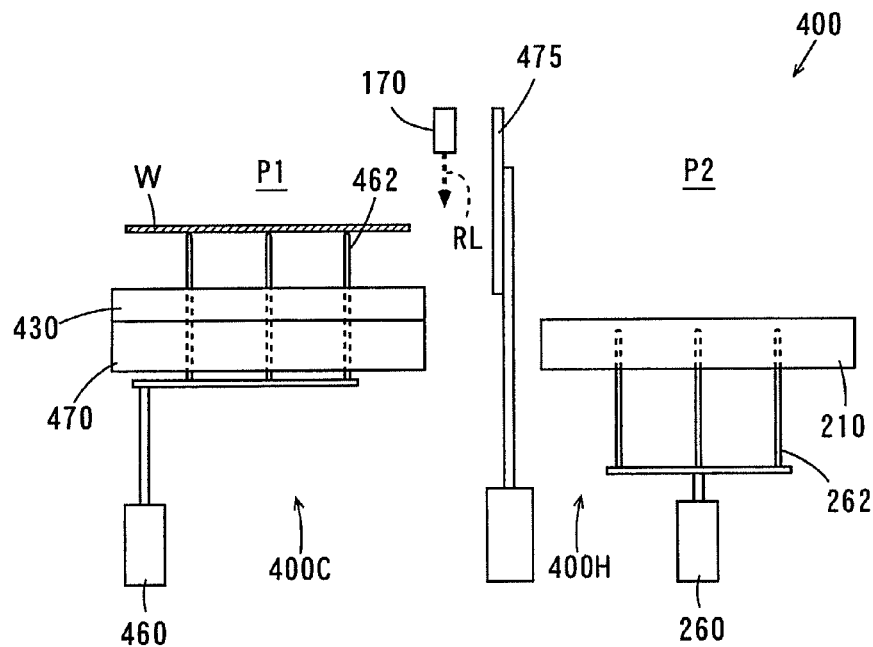
FIG. 22 is a schematic side view showing the operation of the exposure temperature adjustment unit.

As shown in FIG. 22, in the initial state of the thermal processing unit, the upper ends of the plurality of support pins 462 in the cooler 400C are positioned above the substrate platform plate 470, respectively, and the transfer arm 430 of the transfer mechanism 420 comes into contact with the upper surface of the substrate platform plate 470. In this state, the transfer arm 430 is cooled by the substrate platform plate 470. Further, the upper ends of the plurality of support pins 262 in the heater 400H are positioned below the upper surface of the substrate platform plate 210, respectively. Further, the shutter 475 is at the closed position. In this state, the substrate W carried into the exposure temperature adjustment unit 400 through the opening 411 of the casing 410 (FIG. 19) is placed on the plurality of support pins 462 in the cooler 400C.

Figure 23:
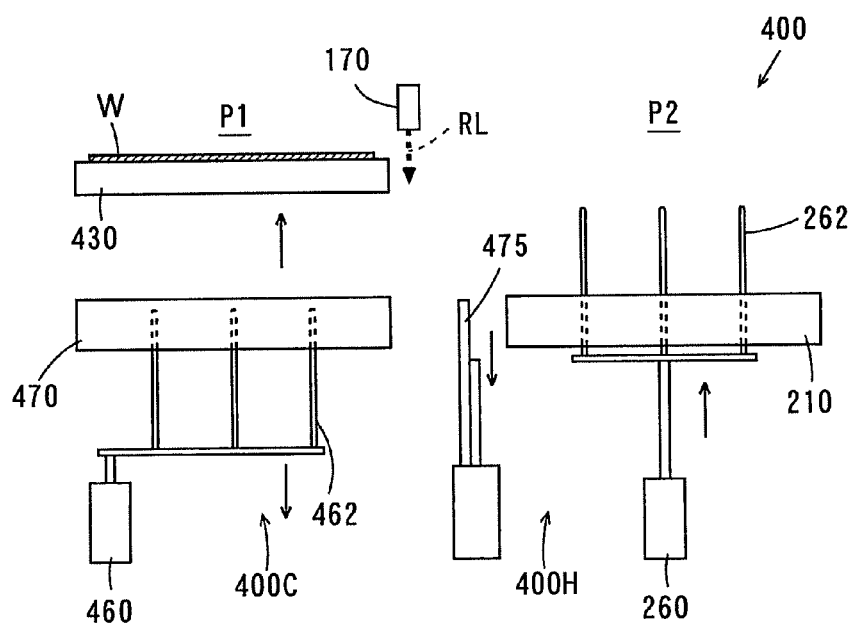
FIG. 23 is a schematic side view showing the operation of the exposure temperature adjustment unit.

Next, as shown in FIG. 23, the transfer arm 430 of the transfer mechanism 420 is lifted to a position above the substrate platform plate 470 in the cooler 400C, and the plurality of support pins 462 in the cooler 400C are lowered to a position below the upper surface of the substrate platform plate 470. Thus, the substrate W is transferred to the transfer arm 430 from the plurality of support pins 462 in the cooler 400C, and the substrate W is held by the transfer arm 430. Further, the upper ends of the plurality of support pins 262 in the heater 400H are lifted to a position above the upper surface of the substrate platform plate 210, respectively. Furthermore, the shutter 475 is moved from the closed position to the opened position.

Figure 24:
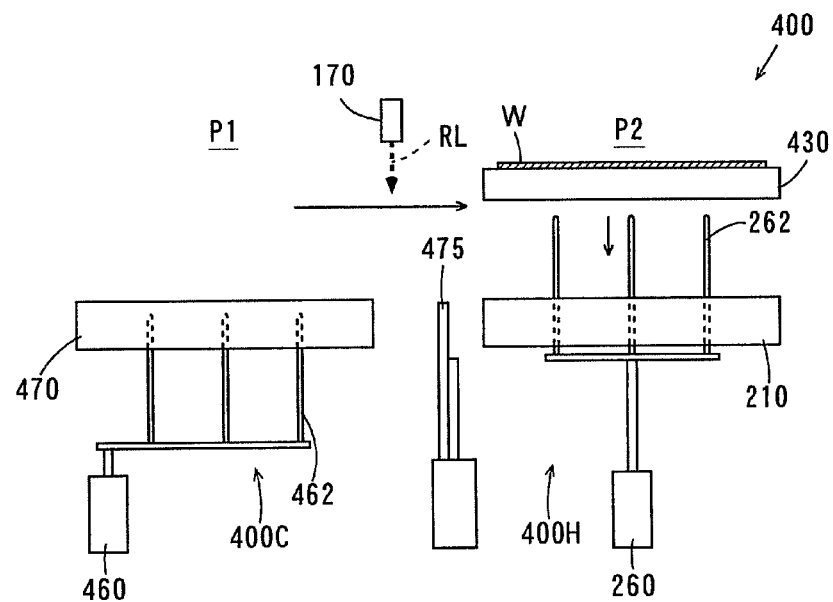
FIG. 24 is a schematic side view showing the operation of the exposure temperature adjustment unit.

Next, as shown in FIG. 24, the transfer arm 430 is moved from the position above the substrate platform plate 470 in the cooler 400C (first position P1) to a position above the substrate platform plate 210 in the heater 400H (second position P2). At this time, the substrate W held by the transfer arm 430 is scanned from the one side towards the other side with the strip-shaped light RL emitted from the light-emitting device 170. Thus, the entire region on the main surface is irradiated with the light RL, and the resist film f1a of FIG. 4(a) is modified (entire region exposure processing).

Figure 25:
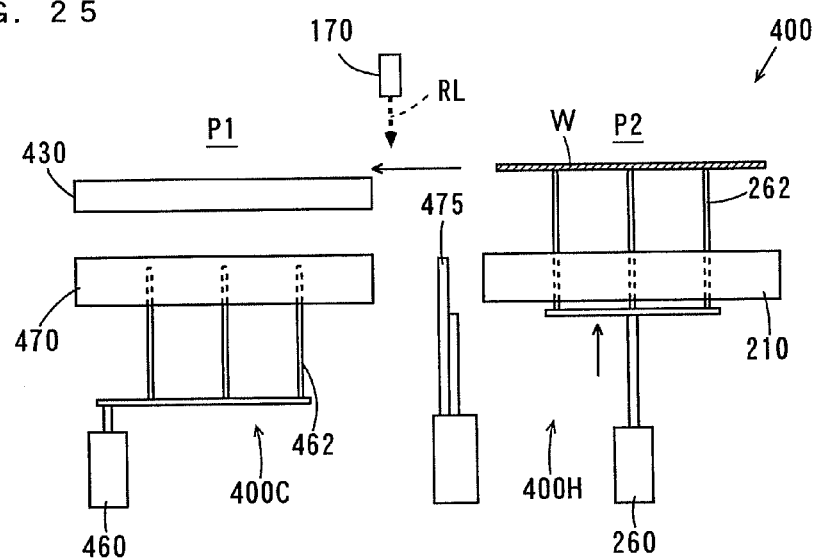
FIG. 25 is a schematic side view showing the operation of the exposure temperature adjustment unit.

Then, the transfer arm 430 is lowered to a position below the upper ends of the plurality of support pins 262. As shown in FIG. 25, this causes the substrate W to be placed on the plurality of support pins 262 in the heater 400H. Thereafter, the transfer arm 430 is moved from a position above the substrate platform plate 210 in the heater 400H (second position P2) to a position above the substrate platform plate 470 in the cooler 400C (first position P1).

Figure 26:
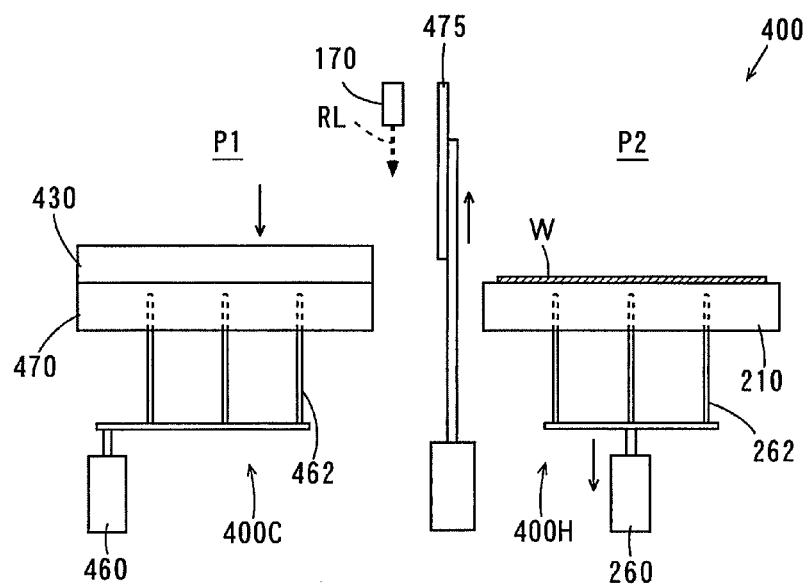
FIG. 26 is a schematic side view showing the operation of the exposure temperature adjustment unit.

Next, as shown in FIG. 26, the plurality of support pins 262 in the heater 400H are lowered to a position below the upper surface of the substrate platform plate 210. This causes the substrate W to be placed on the upper surface of the substrate platform plate 210. In this state, the substrate W is heated by the substrate platform plate 210. Further, the transfer arm 430 is lowered such that the transfer arm 430 comes into contact with the upper surface 470U of the substrate platform plate 470 (FIG. 21). This causes the transfer arm 430 to be cooled by the substrate platform plate 470. Furthermore, the shutter 475 is moved from the opened position to the closed position.

Figure 27:
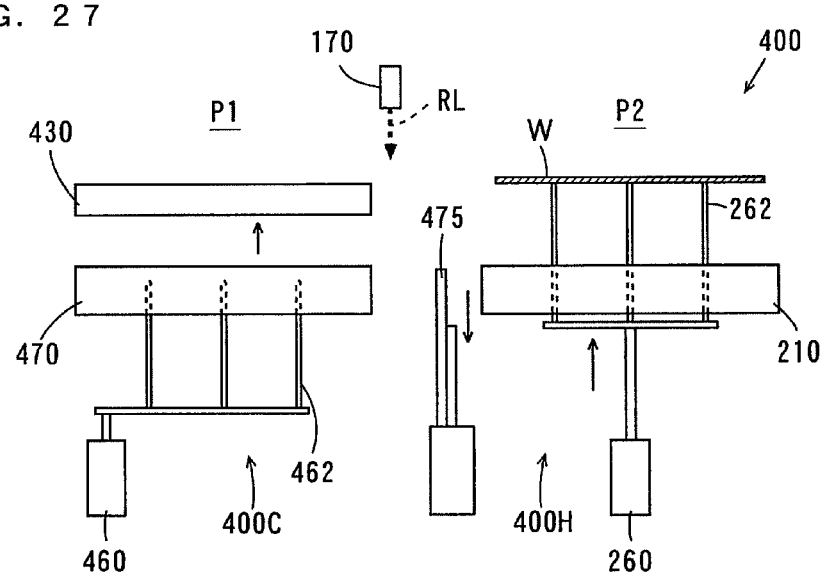
FIG. 27 is a schematic side view showing the operation of the exposure temperature adjustment unit.

Then, as shown in FIG. 27, the upper ends of the plurality of support pins 262 in the heater 400H are lifted to a position above the upper surface of the substrate platform plate 210. This causes the substrate W to be supported by the plurality of support pins 262 in the heater 400H. Further, the transfer arm 430 of the transfer mechanism 420 is lifted to a position above the substrate platform plate 470 in the cooler 400C. Furthermore, the shutter 475 is moved from the closed position to the opened position.

Figure 28:
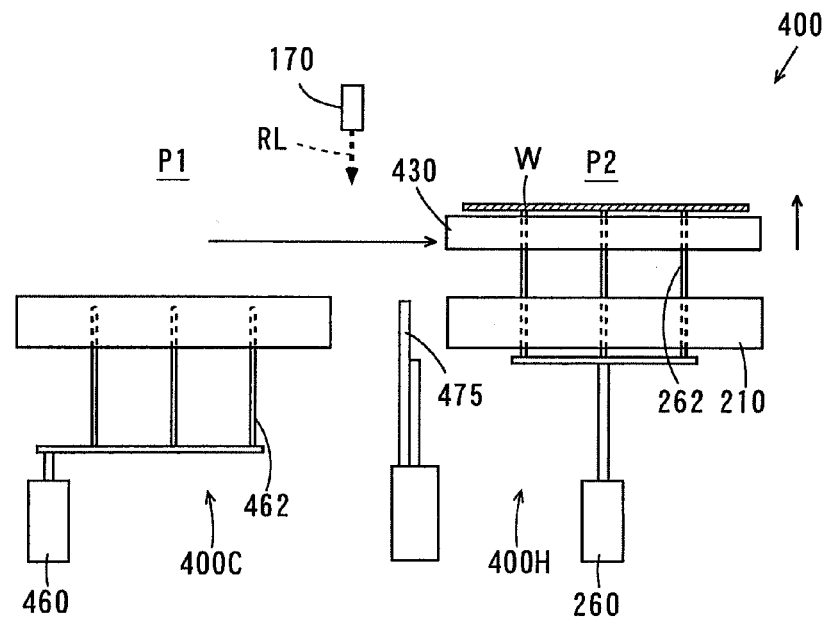
FIG. 28 is a schematic side view showing the operation of the exposure temperature adjustment unit.

Next, as shown in FIG. 28, the transfer arm 430 moves from the position above the substrate platform plate 470 in the cooler 400C (first position P1) to a position above the substrate platform plate 210 (second position P2) in the heater 400H. Then, the transfer arm 430 is lifted to a position above the upper ends of the plurality of support pins 262 in the heater 400H. This causes the substrate W to be received by the transfer arm 430.

Figure 29:
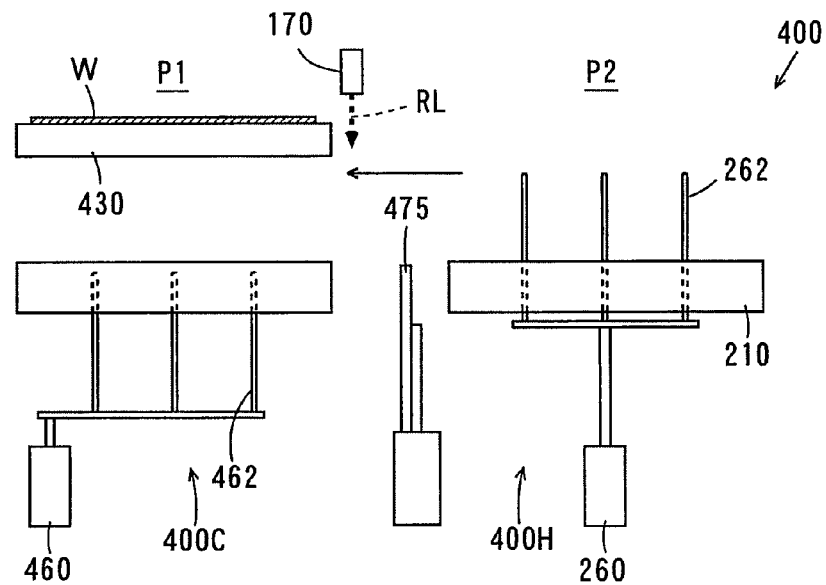
FIG. 29 is a schematic side view showing the operation of the exposure temperature adjustment unit.

Thereafter, as shown in FIG. 29, the transfer arm 430 is moved from the position above the substrate platform 210 in the heater 400H (second position P2) to a position above the substrate platform 470 in the cooler 400C (first position P1). At this time, the substrate W held by the transfer arm 430 is scanned from the other side towards the one side with the strip-shaped light RL emitted from the light-emitting device 170. This causes the entire region exposure processing to be performed again on the substrate W.

Figure 30:
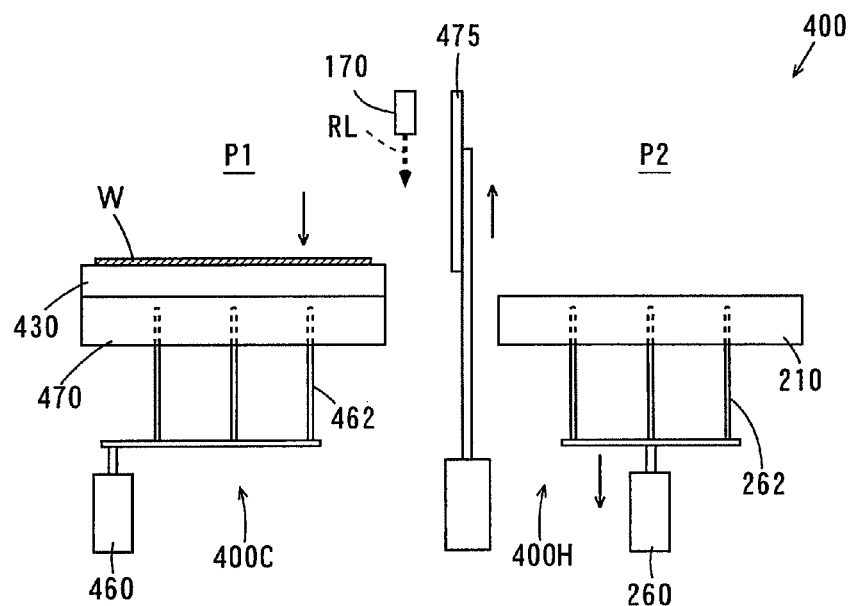
FIG. 30 is a schematic side view showing the operation of the exposure temperature adjustment unit.

Next, as shown in FIG. 30, the transfer arm 430 is lowered until the transfer arm 430 comes into contact with the upper surface 470U of the substrate platform plate 470 (FIG. 21), the shutter 475 is moved from the opened position to the closed position and the plurality of support pins 262 in the heater 400H are lowered to a position below the upper surface of the substrate platform plate 210. In this case, the transfer arm 430 comes into contact with the upper surface 470U of the substrate platform plate 470 (FIG. 21), whereby the substrate W is cooled together with the transfer arm 430 by the substrate platform plate 470.

Figure 31:
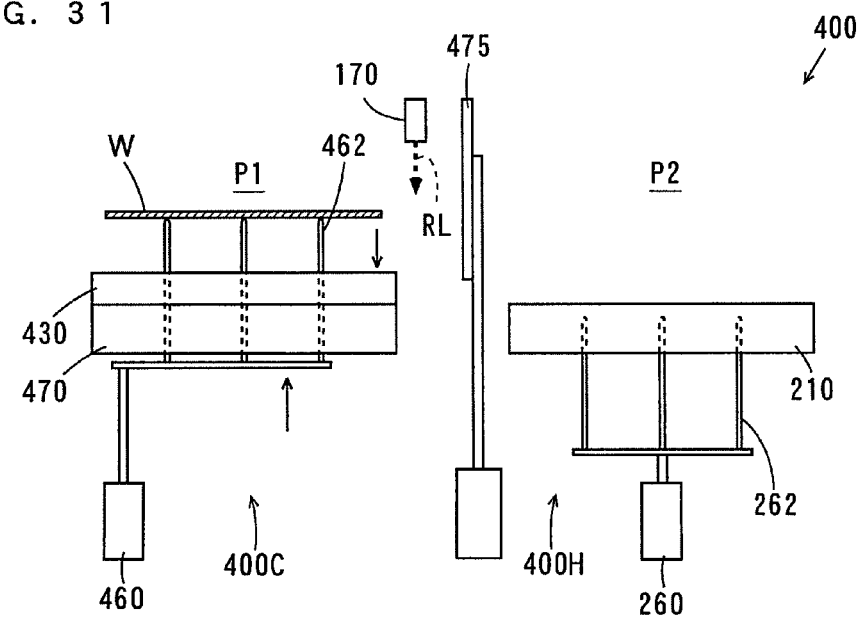
FIG. 31 is a schematic side view showing the operation of the exposure temperature adjustment unit.

Finally, as shown in FIG. 31, the upper ends of the plurality of support pins 462 in the cooler 400C are lifted to a position above the upper surface 470U of the substrate platform plate 470 (FIG. 21). This causes the substrate W to be supported by the plurality of support pins 462 in the cooler 400C. In this state, the substrate W on the plurality of support pins 462 is received by a transfer mechanism (not shown) and carried out through the opening 411 of FIG. 19.

(3) Effects of Seventh Embodiment

As described above, in the exposure temperature adjustment unit 400 according to the present embodiment, the substrate W is moved from the first position P1 to the second position P2, whereby the entire region exposure processing for substrate W using the light-emitting device 170 and the heating processing for the substrate W are successively performed.

The resist film f1a of FIG. 4(a) formed on the main surface of the substrate W is modified by the heating processing. In this case, the resist film f1a is modified downward during the entire region exposure processing, and the substrate platform plate 210 in the heater 400H generates heat during the heating processing such that the resist film f1a is modified upward. Thus, the resist film f1a formed on the main surface of the substrate W is uniformly modified from the main surface side and the back surface side by the two methods and also in a short time.

Further, the substrate W is moved from the second position P2 to the first position P1, whereby the entire region exposure processing for the substrate W using the light-emitting device 170 and the cooling processing for the substrate W are successively performed. This causes the entire region exposure processing to be performed again, and therefore the resist film f1a on the main surface of the substrate W is sufficiently modified. Further, when a temperature of the substrate W rises due to the entire region exposure processing, a temperature of the substrate W after the entire region exposure processing can be quickly lowered by the substrate platform plate 470 in the cooler 400C. As a result, the subsequent processing can be performed on the substrate W after the entire region exposure processing without waiting time.

Furthermore, in the exposure temperature adjustment unit 400, the transfer arm 430 comes into contact with the upper surface 470U of the substrate platform plate 470 in the cooler 400C (FIG. 21), whereby a transfer arm 430 is cooled. Therefore, when a temperature of the transfer arm 430 rises due to the entire region exposure processing, the remaining heat in the transfer arm 430 is removed. Therefore, thermal conduction from the transfer arm 430 to the substrate W, before the entire region exposure processing, carried into the exposure temperature adjustment unit 400 is prevented.

As a result, the resist film f1a is uniformly and sufficiently modified and throughput of the substrate processing is improved while non-uniformity of the temperature of the photosensitive film caused by thermal conduction from the transfer arm 430 is prevented.

[8] Other Embodiments (1) While the entire region exposure processing is performed on the substrate W before the intermediate liquid coating processing in the embodiment described above, the invention is not limited to this. The entire region exposure processing may be performed on the substrate W after the intermediate liquid coating processing instead of on the substrate W before the intermediate liquid coating processing.

(2) While only the holders holding the substrate W (the local transfer hand RHR, the hands CRH1, CRH2 and IRH and the transfer arm 430) are moved relative to the light-emitting device 170 such that the entire region exposure processing is performed on the substrate W in the embodiment described above, the invention is not limited to this.

While only the holders holding the substrate W are moved relative to the light-emitting device 170, only the light-emitting device 170 may be moved relative to the holders holding the substrate W instead. In this case, the light-emitting device 170 that emits the strip-shaped light RL moves above the main surface of the substrate W held by the holders, whereby the main surface of the substrate W is scanned with the strip-shaped light RL and the entire region exposure processing is performed.

The invention is not limited to the above-mentioned example. Further, the holders holding the substrate W and the light-emitting device 170 both may be moved relative to each other such that the entire region exposure processing is performed.

(3) While the description is made of the case where the entire region exposure unit 100 is provided in the substrate processing apparatuses 500, 600 in the embodiment described above, the invention is not limited to this. The entire region exposure unit 100 may be provided in another substrate processing apparatus, or alternatively, the entire region exposure unit 100 may be used alone.

(4) While the light-emitting device 170 is provided in the entire region exposure unit 200 in the sixth embodiment, the invention is not limited to this. Similarly to the second to the fifth embodiments, the light-emitting device 170 may be provided in the transfer section 112 in the indexer block 14 in the substrate processing apparatus 600 according to the sixth embodiment. In this case, the entire region exposure unit 100 is constituted by the transfer mechanism 115, the hand 116 and the light-emitting device 170 in the indexer block 14.

(5) In the exposure temperature adjustment unit 400 according to the seventh embodiment, a cooler that is capable of adjusting a temperature of the substrate W with high accuracy may be provided at the second position P2 instead of the heater 400H. Such as a substrate platform plate including a peltier element can be used as the cooler.

Thus, when a temperature of the substrate W rises due to the entire region exposure processing while the substrate W is being moved from the first position P1 to the second position P2, for example, a temperature of the substrate W after the entire region exposure processing can be quickly and accurately lowered to a desired temperature at the second position P2. Therefore, subsequent processing can be performed on the substrate W after the entire region exposure processing without waiting time.

In this case, in order to prevent the substrate W of which a temperature is lowered by the cooler after the entire region exposure processing from being irradiated again with the light RL emitted from the light-emitting device 170, the emission surface 171 of the light-emitting device 170 needs to be covered with a light shielding member, or the emission of the light RL from the light-emitting device 170 to the moving path of the substrate W needs to be stopped while the substrate W is being moved from the second position to the first position.

(6) In the exposure temperature adjustment unit 400 according to the seventh embodiment, a heater may be provided instead of the cooler 400C at the first position P1. This enables the heating processing and the entire region exposure processing for the substrate W to be successively performed in the exposure temperature adjustment unit 400 when the heating processing for the substrate W needs to be performed from the initial state of FIG. 4(a) until the entire region exposure processing of FIG. 4(b) is performed, for example. As a result, throughput of the substrate processing is improved.

For example, when the substrate platform plate 470 for the cooling processing in the cooler 400C is changed to the substrate platform plate 210 for the heating processing in the heater 400H, the transfer arm 430 is heated by coming into contact with the upper surface of the substrate platform plate 210 at the first position P1. This causes the substrate W to be held by the transfer arm 430, whereby heat is conducted from the transfer arm 430 to the substrate W. In this case, the substrate platform plate 210 functions as a temperature processing mechanism in this invention. As a result, the heating processing for the substrate W can be performed when the substrate W is being moved by the transfer arm 430, and throughput of the substrate processing is further improved.

(7) While the light-emitting device 170 is provided in a space between the one sidewall 410a of the casing 410 of FIG. 19 and the shutter 475 (a space surrounding the cooler 400C and the light-emitting device 170) in the exposure temperature adjustment unit 400 according to the seventh embodiment, the invention is not limited to this. While the light-emitting device 170 is provided in a space between the one sidewall 410a of the casing 410 of FIG. 19 and the shutter 475, the light-emitting device 170 may be provided in a space between the shutter 475 and the other sidewall 410b of the casing 410 of FIG. 19 (a space surrounding the heater 400H) instead.

Further, the light-emitting device 170 may be configured to be relatively movable to the substrate platform plate 210 in a space from the shutter 475 to the other sidewall 410b of the casing 410 of FIG. 19 (a space surrounding the heater 400H). In this case, the substrate platform plate 210 functions as the holder in this invention. This enables the resist film f1a on the main surface of the substrate W to be irradiated with the light RL from above the substrate W while the heating processing is being performed on the substrate W by the substrate platform plate 210. As a result, the resist film f1a is quickly and uniformly modified without moving the substrate W.

(8) While the light-emitting device 170 including an LED as a light source for performing the entire region exposure processing on the substrate W is used in the first to the seventh embodiments described above, the invention is not limited to this. The light-emitting device 170 including another light source other than an LED as a light source for performing the entire region exposure processing may be used. Examples of the light source other than an LED include a halogen lamp, a xenon lamp, a mercury lamp and the like.

In order to stabilize the intensity of the light RL generated from the light source, the light source is preferably always turned on while the substrate processing apparatus 600 is turned on. Therefore, when the substrate W is moved between the first position P1 and the second position P2 without performing the entire region exposure processing, the emission surface 171 of the light-emitting device 170 is preferably covered with the light shielding member in order to prevent emission of the light RL from the light-emitting device 170 to the moving path of the substrate W.

[9] Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the embodiments described above, the substrate W is an example of a substrate, the entire region exposure unit 100 and the exposure temperature adjustment unit 400 are examples of an exposure device, the resist films f1a, f1b are examples of a photosensitive film and the light-emitting device 170 is an example of a light emitter.

Further, the local transfer hand RHR, the hands CRH1, CRH2, IRH, and the hands H1, H2 provided in the transfer mechanisms 627, 628 and the transfer arm 430 are examples of a holder, and the local transfer mechanism 140, the first central robot CR1, the indexer robot IR, the transfer mechanisms 627, 628 and the transfer mechanism 420 are examples of a relative mover.

Further, the light RL that is emitted from the light-emitting device 170 is an example of light and strip-shaped light, the first position P1 is an example of a first position, the second position P2 is an example of a second position, the plurality of fixed support pins 121, the supporter in the alignment device 300 and the support platform plate 210 are examples of a supporter and the cooling plate 120 of the platforms 110, 220 and the adjustment mechanism in the alignment device 300, the substrate platform plate 210 and the substrate platform plate 470 are examples of a processing mechanism.

Further, the cooling plate 120 in the platform sections 110, 220, the substrate platform plate 210 and the substrate platform plate 470 are examples of a temperature processor, the substrate platform plate 210 is an example of a heating processor and the substrate platform plate 470 is an example of a cooling processor.

Further, the upper surface 470U of the substrate platform plate 470 is an example of a contact surface, the substrate platform plate 470 is an example of a first temperature processor, the lifting/lowering device 260, the coupling member 261 and the plurality of support pins 262 are examples of an interface mechanism, the substrate platform plate 210 is an example of a second temperature processor and the substrate platform plate 470 and the substrate platform plate 210 are examples of a temperature processing mechanism.

Further, the substrate processing apparatuses 500, 600 are examples of a substrate processing apparatus, and the coating unit 50U, the development liquid supply unit 60U, the coating unit 70U, the coating unit 629, the development liquid supply unit 639, the heating unit HP, the cooling unit CP and the thermal processing unit PHP are examples of a processing section.

Furthermore, the intermediate liquid is an example of a first processing liquid, the coating unit 50U and the coating unit 629 in the first processing block 15 are examples of a first processing liquid coating device, the development liquid supply unit 60U and the development liquid supply unit 639 in the second processing block 16 are examples of a development device, the DSA liquid is an example of a second processing liquid and the coating unit 70U and the coating unit 629 in the second processing block 16 are examples of a second processing liquid coating device.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. An exposure device that exposes a substrate, comprising:
a holder that holds a substrate having one surface on which a photosensitive film having a predetermined pattern is formed;
a light emitter that emits light for modifying the photosensitive film; and
a relative mover that is configured to move at least one of the holder and the light emitter relative to the other such that the one surface of the substrate held by the holder is irradiated with the light emitted by the light emitter;
wherein the light emitter is arranged so as to emit the light to a space between a first position and a second position that are spaced apart from each other, and
the relative mover is configured to move the holder that holds the substrate between the first position and the second position;
further comprising a first temperature processor that is provided at the first position, has a contact surface with which the holder can come into contact and performs first temperature processing on the substrate held b the holder while the holder is in contact with the contact surface;
a second temperature processor that is configured to be capable of supporting the substrate at the second position and performs second temperature processing on the substrate; and
an interface mechanism for receiving and transferring the substrate between the holder and the second temperature processor,
wherein the relative mover is configured to move the holder to the first position such that the holder holding the substrate comes into contact with the contact surface of the first temperature processor.

2. The exposure device according to claim 1, wherein the light emitter is configured to be capable of emitting strip-shaped light that extends in a direction intersecting a relative moving direction of the at least one of the holder and the light emitter.

3. The exposure device according to claim 1, wherein the relative mover is configured to move the holder holding the substrate back and forth between the first position and the second position, and the light emitter emits the light while the holder holding the substrate is being moved from the first position to the second position and from the second position to the first position.

4. The exposure device according to claim 1, further comprising:
a supporter that supports the substrate at the first position or the second position; and
a processing mechanism that performs predetermined processing on the substrate supported by the supporter.

5. The exposure device according to claim 4, wherein the processing mechanism includes a temperature processor that performs temperature processing on the substrate supported by the supporter.

6. The exposure device according to claim 5, wherein the temperature processor includes a heating processor that performs heating processing as the temperature processing on the substrate supported by the supporter.

7. The exposure device according to claim 5, wherein the temperature processor includes a cooling processor that performs cooling processing as the temperature processing on the substrate supported by the supporter.

8. The exposure device according to claim 7, wherein the cooling processor is configured to perform the cooling processing on the substrate that has been irradiated with the light emitted by the light emitter.

9. The exposure device according to claim 1, wherein the first temperature processor includes a cooling processor that performs cooling processing as the first temperature processing on the substrate held by the holder, and the second temperature processor includes a heating processor that performs heating processing as the second temperature processing on the substrate supported by the second temperature processor.

10. The exposure device according to claim 1, further comprising:
a temperature processing mechanism that performs temperature processing on the substrate held by the holder.

11. A substrate processing apparatus comprising:
the exposure device according to claim 1; and
a processing section that performs predetermined processing on the substrate before or after exposure by the exposure device.

12. The substrate processing apparatus according to claim 11, wherein
the processing section includes a first processing liquid coating device that applies a first processing liquid that is insoluble in a development liquid to one surface of the substrate, on which the photosensitive film is formed, before or after the exposure by the exposure device.

13. The substrate processing apparatus according to claim 12, the processing section further includes
a development device that performs development processing on the substrate after the exposure by the exposure device and application of the first processing liquid by the first processing liquid coating device.

14. The substrate processing apparatus according to claim 13, the processing section further includes
a second processing liquid coating device that applies a second processing liquid including a directed self assembly material on the one surface of the substrate after the development processing by the development processing device.

* * * * *